United States Patent
Seremeta

(10) Patent No.: US 7,245,189 B2
(45) Date of Patent: Jul. 17, 2007

(54) HIGH LINEARITY DIGITAL VARIABLE GAIN AMPLIFIER

(75) Inventor: Dorin Seremeta, Cupertino, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 11/327,052

(22) Filed: Jan. 6, 2006

(65) Prior Publication Data

US 2006/0114065 A1    Jun. 1, 2006

Related U.S. Application Data

(63) Continuation of application No. 10/307,200, filed on Nov. 29, 2002, now Pat. No. 7,071,784.

(51) Int. Cl.
*H03F 3/04* (2006.01)
(52) U.S. Cl. ............... 330/311; 330/151; 327/560; 327/574
(58) Field of Classification Search ........... 330/310, 330/311, 297, 98, 151, 152; 327/560, 574
See application file for complete search history.

(56) References Cited

U.S. PATENT DOCUMENTS 4,728,905 A    3/1988   Zhiwer 6,278,328 B1    8/2001   Yamamoto et al.
6,778,016 B2 *  8/2004   Luo ................... 330/288

OTHER PUBLICATIONS

Sedra et al. "Microelectronic Circuits," 5th edition Oxford University Press 2004, pp. 801-807 and 864-865.

* cited by examiner

*Primary Examiner*—Michael B Shingleton
(74) *Attorney, Agent, or Firm*—McDermott Will & Emery LLP

(57) ABSTRACT

Variable gain amplifiers offering high frequency response with improved linearity and reduced power dissipation are provided. An amplifier is disclosed that is constructed from a one-stage topology with multiple signal paths and compensation networks for improved linearity and stable operation. In this amplifier, improved performance is obtained by replacing single transistor components with enhanced active devices which incorporate local negative feedback. One embodiment of the invention is a transconductance enhancement circuit that improves transconductance and input impedance relative to the prior art. A further development is an enhanced active cascode circuit that provides improved linearity. A high frequency bipolar transistor switch is also disclosed that incorporates lateral PNP transistors as high frequency switches with improved OFF-state to ON-state impedance ratio to realize a variable gain function. These circuits are combined in an amplifier circuit that provides variable gain and high frequency performance, with improved linearity, gain, and input impedance.

18 Claims, 14 Drawing Sheets

HIGH LINEARITY DIGITAL VARIABLE GAIN AMPLIFIER

CROSS REFERENCE TO RELATED APPLICATIONS

This application is a continuation of application Ser. No. 10/307,200 filed on Nov. 29, 2002 now U.S. Pat. No. 7,071,784 and entited "High Linearity Digital Variable Gain Amplifier", which is hereby incorporated by reference herein in its entirety.

BACKGROUND OF THE INVENTION

The present invention relates to variable gain amplifiers. More particularly, the present invention relates to amplifiers with a high linearity and efficiency over a wide range of voltage levels that can be constructed in a variety of different topologies. One such topology is a grounded input active cascode configuration that increases gain while maintaining a high level of linearity. Another such topology is a composite NPN transistor configuration that realizes minimum complexity, high unity gain, and enhanced transconductance.

Amplifiers are used in a wide variety of applications. Generally, amplifiers are employed in applications where the voltage or current of a signal needs to be increased. One such application exists, for example, in communication transmitters where the voltage levels of audio signals are "weak" and need to be amplified so that they may be transmitted over relatively long distances. As per another example, a radio amplifies relatively small digital signals so that these signals may be heard by a user.

The simplest form of an amplifier is realized through the use of a single bipolar junction transistor (BJT). FIG. 1A illustrates a prior art single BJT amplifier 100 that is configured to increase input voltage 102 to output voltage 104. When amplifier 100 is in an active mode (e.g., amplifier 100 is ON), the current in the collector terminal of transistor 122 can be mapped to the current in the base terminal of transistor 122 with respect to an internal gain factor $\beta$. Specifically, the collector current of active mode transistor 122 is expressed as follows:

$$I_{COLLECTOR} = (I_{BASE}) * \beta$$

Similarly, the emitter current of transistor 122 when amplifier 100 is in an active mode can be mapped to the current in the collector of transistor 122 with respect to the internal gain factor $\beta$ such that:

$$I_{EMITTER} = (I_{COLLECTOR}) * (\beta+1)/(\beta)$$

Amplifier 100 is constructed in a single-stage common-emitter configuration such that the emitter terminal is neither being utilized as the input nor the output of amplifier 100 (e.g., the emitter terminal is coupled to ground through resistor 112). Similarly, amplifier 100 can be constructed to be in a common-collector configuration (e.g., the base terminal receives an input signal and the emitter terminal provides an output signal) or a common-base configuration (e.g., the emitter terminal receives an input signal and the collector terminal provides an output signal).

As shown in FIG. 1A, amplifier 100 creates an amplified voltage differential across resistors 112 and 114 that is upwardly delimited by supply voltage 108. One disadvantage associated with using amplifier 100 relates to its inability to provide linear amplification over a substantial range of circuit conditions because it fails to preserve the original signal by a known gain, which is generally measured as the ratio of the output signal to the input signal of the amplifier, over the range of circuit conditions. Moreover, providing amplification with a known gain is important to avoid distortion of the signal being amplified. Single transistor prior art amplifiers do not exhibit a high level of linearity and, as a result, often introduce undesirable distortions into the amplified signal.

The transconductance ($G_m$) of an amplifier is a primary factor in modeling gain for that amplifier. The transconductance of amplifier 100 is the ratio of the change in current in the collector of transistor 122 to the change in voltage at the base terminal of transistor 122 over a defined, arbitrarily small, time interval. Linearity occurs when, for any two of the arbitrarily small intervals, the transconductance of an amplifier is constant. However, when a load is placed across differential 104, the transconductance of amplifier 100 changes for varying circuit conditions. As a result, amplifier 100 does not exhibit a high level of linearity across the full range of circuit conditions. Accordingly, it would be desirable to construct an amplifier that exhibits a high level of linearity across a full range of circuit conditions.

Furthermore, the voltage swing of amplifier 100 is severely delimited and has an output representative of a half-rectified wave. Only input voltages that are greater than the voltage threshold between the base terminal and emitter terminal of transistor 122 (e.g., voltages greater than the turn-ON voltage of transistor 122) will activate the transistor, allowing amplification to occur. The voltage headroom (e.g., the difference between the supply voltage and the maximum amplifier output voltage) of amplifier 100 is also limited by the point at which transistor 122 becomes saturated and by the impedance present at the collector terminal of transistor 122. Accordingly, it would be desirable to construct an amplifier with improved-headroom.

As transistor 122 of amplifier 100 changes states, the charge transport that occurs inside transistor 122 is not instantaneous and the transistor's internal charge characteristics take time to rearrange. If an input signal changes faster than the internal charge profile of transistor 122 can rearrange itself, then the output of amplifier 100 will not be an amplified signal representative of the input signal. Thus, prior art amplifiers are greatly limited in the range of frequencies that they can successfully copy and enhance. For many applications, it would be desirable to construct an amplifier that can operate at high frequencies and in a focused bandwidth.

FIG. 1B shows another prior art single-BJT amplifier 150. In amplifier 150, the current applied to base terminal 154 of transistor 151 is amplified such that the current in collector terminal 152 is substantially equivalent to the current in base terminal 154 multiplied by the 'internal gain factor $\beta$ of transistor 151. More particularly, the gain of amplifier 150 is as follows:

$$I_{152} = I_{154}(\beta+1)$$

Resistor 156 and voltage source 158 may affect, or provide, the voltage located at base terminal 154 of transistor 151. Resistor 155 is utilized to control the transconductance of amplifier 150, which is defined as the current in collector terminal 152 divided by the voltage at base terminal 154. However, resistor 155 limits the range of signals that can be present at base terminal 154 of transistor 151, decreases gain (by increasing the voltage present at base terminal 154 of transistor 151), and contributes to noise degradation in amplifier 150. A compact amplifier circuit with increased frequency response, higher gain, and less internal noise is therefore desirable.

In order to stabilize linearity, feedback loops are occasionally integrated into an amplifier. Amplifier circuit 130 is illustrated in FIG. 1C and includes a negative current feedback loop which allows current at node 135 (e.g., the output of amplifier 131) to be drawn into node 134 (e.g., the inverting input of amplifier 131) by resistor 136. Amplifier 131 has a non-inverting input terminal connected to ground 139. Negative feedback loops may be utilized to help stabilize the linearity of an amplifier. As shown by example, the voltage across capacitor 138 and resistor 137 will be as follows:

$$V_{138} = V_{133}(R_{136} + R_{132})/R_{132}$$

However, in stabilizing linearity, amplifier circuit 130 does not provide a way to change its gain. As a result, compact amplifiers that include variable gain functionality are desired.

Amplifiers are frequently fabricated on an integrated semiconductor circuit (or chip). Such amplifiers are occasionally placed under different temperature conditions dependant upon the placement of an amplifier with respect to any heat producing components present on the chip. For example, an increased temperature exists around a chip's output nodes when these nodes exhibit HIGH voltages. The difference in temperature between two locations on a chip can be on the order of several degrees Celsius. Sub-micron amplifiers placed under different temperatures have different operating and performance characteristics. Therefore, it would be desirable to design amplifiers that exhibit the same operating and performance characteristics regardless of temperature.

SUMMARY OF THE INVENTION

In light of the foregoing, it would be desirable to provide amplifier circuitry which alleviates the problems present in the prior art amplifiers described above.

One object of the present invention is to provide a compact variable gain transconductance amplifier that exhibits a high level of linearity over an increased range of input voltage signals, improved (e.g., minimized) headroom, and that is capable of operating at high frequencies and varying temperatures.

One embodiment of the present invention is a composite NPN amplifier circuit that has minimal complexity (e.g., a minimal number of circuit components) and is capable of operating at a very high unity gain frequencies (e.g., frequency of a device at which $I_{COLLECTOR}/I_{BASE}$ is 1). More particularly, a composite amplifier constructed in accordance with the principles of the present invention contains many of the advantages of a single transistor and operates similar to a single transistor. However, performance enhancing components are integrated into the composite transistor amplifiers of the present invention. For example, a composite amplifier of the present invention has excellent linearity due to an enhanced transconductance.

Another embodiment of the present invention is a cascode stage composite transistor amplifier which, similar to the embodiment described above, provides excellent linearity over a larger voltage swing than conventional amplifier topologies. In the cascode stage amplifier topology, the circuit is preferably designed to provide compensation for the base current of the transistor whose collector terminal provides the output of the cascode amplifier. In this manner, a greater voltage swing at the output is possible without degradation of the signal being amplified.

In another embodiment according to the present invention, a one-stage amplifier circuit topology that includes multiple composite transistors can be constructed to share or use bias voltage or current. For example, the output of the composite NPN amplifier can be coupled to the input of the cascode amplifier that is fabricated to have a virtual ground input (e.g., the input maintains a steady voltage with little voltage swing). In such an embodiment, power usage is optimized because the virtual ground of the cascode amplifier is used to bias the composite NPN amplifier. Conversely, the bias current used to bias the composite NPN amplifier may be carried through to the NPN amplifier to bias the cascode amplifier. Such a topology saves power when compared to a two-stage amplifier where each amplifier is biased separately and independently. A one-stage amplifier constructed in accordance with the principles of the present invention may exhibit, for example, unmatched linearity performance at frequencies up to 10% of the amplifier's unity gain frequency while realizing the highest level of power gain.

Another object of the present invention is to provide amplifiers which operate substantially uniformly regardless of their placement on an integrated circuit. In preferred embodiments, the present invention biases each amplifier (e.g., the one-stage amplifier described above) with a separate bias source that provides a stabilized current regardless of temperature. In doing so, temperature does not affect the performance of multiple amplifiers constructed in accordance with the principles of the present invention and included in different locations on the same integrated circuit.

Other embodiments of the present invention include variable gain functionality such that the transconductance of an amplifier is controlled. An enhanced lateral PNP switch is preferably employed in such functionality.

BRIEF DESCRIPTION OF THE DRAWINGS

The above and other advantages of the present invention will become apparent upon consideration of the following detailed description, taken in conjunction with the accompanying drawings, in which like reference characters refer to like parts throughout, and in which.

DETAILED DESCRIPTION OF THE INVENTION

Figure 2:
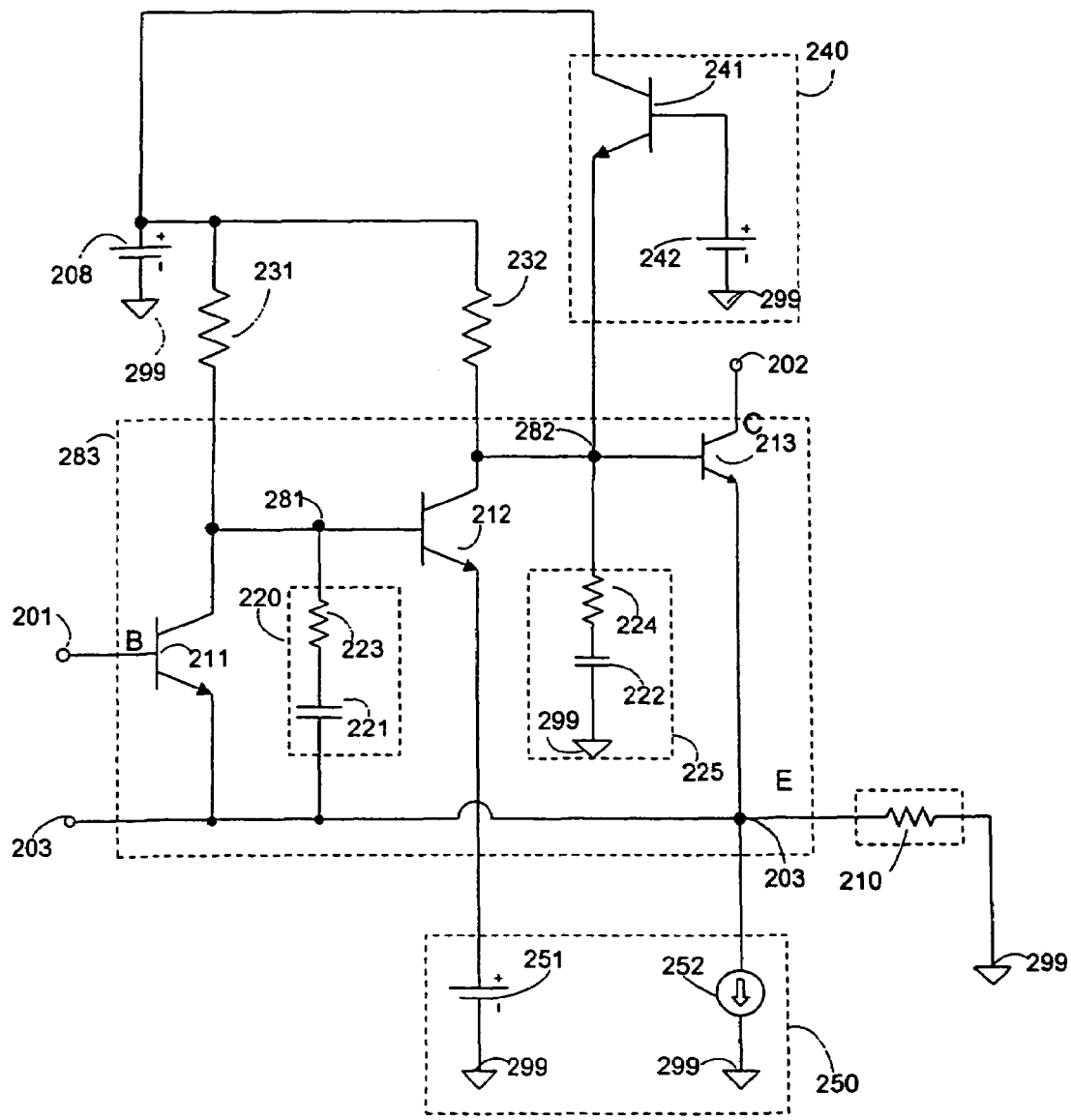
FIG. 2 is a schematic diagram of an enhanced composite transistor amplifier constructed in accordance with the principles of the present invention.

FIG. 2 depicts amplifier 200 that is constructed to include enhanced composite NPN transistor 283 that amplifies a voltage signal at input 201 to a current signal at output 202. Amplifier 200 is a compact amplifier structured around a composite NPN transistor that is capable of operating at a very high unity gain frequencies (e.g., frequencies of approximately 1 GHz to 2 GHz).

One example of applications in which amplifier 200 or composite transistor 283 may be beneficial are in applications operating at intermediate frequencies (e.g., frequencies of approximately 600 MHz to 1 GHz). As will be discussed below, amplifier 200 and composite transistor 283 may be configured in various topologies and modified to optimize, for example, gain, linearity, unity gain frequency, power, transconductance, transresistance, and noise characteristics.

Enhanced composite transistor 283 preferably includes transistor 211, which defines the base terminal of composite transistor 283 at input 201, and transistor 213, which defines the collector terminal and the emitter terminal of composite transistor 283 at output 202 and node 203, respectively. Composite transistor 283 also includes transistor 212.

Transistors 211, 212, and 213 define a negative feedback loop that is internal to composite transistor 283. Generally, the negative feedback loop of composite transistor 283 is the feedback loop flowing through transistors 211, 212, and 213 via nodes 203, 281, and 282. The collector terminal of transistor 211 is coupled to the base terminal of transistor 212 at node 281 while the collector terminal of transistor 212 is coupled to the base terminal of transistor 213 at node 282. Furthermore, the emitter terminal of transistor 211 is coupled to emitter terminal of transistor 213. The feedback loop is negative due to the inversion signal characteristics of transistor 212 and the non-inversion signal characteristics of transistors 211 and 213.

Persons skilled in the art will appreciate that the negative feedback loops of the present invention preferably have a path through an odd number of inversion transistors (e.g., transistors with signal inversion characteristics). For this reason, the number of inversion transistors included in composite transistor 283 are not limited to one (e.g. transistor 212) and may include any odd number of inversion transistors (e.g., three or five).

Turning first to transistor 211 of composite transistor 283, transistor 211 is constructed in a common-base configuration (defined above) and exhibits about zero current variation at node 281 (e.g., the collector terminal of transistor 211). In this manner, constant current flows between the collector terminal of transistor 211 (e.g., node 281) and the emitter terminal of transistor 211 (e.g., node 203). This characteristic occurs, in part, because of the current source behavior of resistor 231 and the current gain of transistor 212.

While transistor 211 does not provide current gain, transistors 212 and 213 do provide a very high current gain in composite transistor 283. Particularly, transistor 212 has a gain of $\beta_2$ and transistor 213 has a gain of $\beta_3$. As a result of feeding the amplified signal created by transistor 212 through transistor 213 a gain on the order of $\beta_2 * \beta_3$ is realized. More particularly, transistors 212 and 213 ideally provide a current gain $IA_{200}$ a follows:

$$IA_{200} = \beta_2 * \beta_3 + \beta_2 + \beta_3$$

Persons skilled in the art will appreciate that the gain of transistors 212 and 213 may preferably be the same (e.g., approximately 5% to 10% gain). Moreover, although fabricating transistors 212 and 213 to have different gains would require introducing extra process steps thus increasing the cost of fabricating composite transistor 283, persons skilled in the art will appreciate that fabricating transistors 212 and 213 to have different gains is within the scope of the present invention.

Transistors 212 and 213 are preferably biased such that transistors 212 and 213 may operate at the highest unity gain point of an NPN transistor. This biasing preferably sets transistors 212 and 213 such that the two transistors perform as if they were a single high unity gain NPN transistor (e.g., transistor 213 uncoupled and operating independent from amplifier 200). As such, the maximum unity gain is preferably realized for the negative feedback loop of composite transistor 283.

Referring back to transistor 211, transistor 211 may provide relatively high input impedance to amplifier 200, and composite transistor 283, at input 201. Thus, composite transistor 283 provides a higher input impedance than a single NPN transistor. In one embodiment, transistor 211 may befabricated to have a relatively large surface area such that the base resistance internal to transistor 211 is reduced in order to provide a higher input impedance.

By enlarging the surface area of transistor 211, the operating bias point of transistor 211 will be preferably maintained below the potential maximum frequency unity gain point of an NPN transistor operating independently. In preferred embodiments, transistor 211 may be sized to have a surface area greater than the surface area of transistor 212. Enlarging the surface area of transistor 211 decreases the noise contribution of the internal base resitance of transistor 211, a characteristic important to numerous amplifications.

Transistors 211 and 212 are preferably powered at the collector terminals (e.g., nodes 281 and 282, respectively) by resistors 231 and 232, respectively. Resistors 231 and 232 are coupled to voltage source 208. Resistors 231 and 232 are primarily utilized as voltage-to-current conversion elements such that a regulated current is provided to the collector terminals of transistors 211 and 212.

Persons skilled in the art will appreciate that the collector currents of transistors 212 and 213 can be biased such that they are close to the maximum collector current present in transistors operating at maximum unity gain frequency of an NPN transistor while transistor 211 may biased to be below this point depending on what noise versus linearity characteristics are desired.

Persons skilled in the art will appreciate that the collector terminals of transistors 211 and 212 may be biased with circuit elements other than a voltage producing element coupled to a resistive element. For example, voltage source 208 and resistor 231 may be a current source or current input node. Furthermore, biasing sources in accordance with the principles of the present invention may be sources internal or external to the circuit being biased. Moreover, all multiple voltage or current sources may be included as a single voltage or current source, respectively.

The collector terminal of transistor 212 is coupled to the base terminal of transistor 213 at node 282. Transistor 213 is preferably provided in a common-collector configuration from the perspective of the negative feedback loop of composite transistor 283 because the base-emitter are both part of the negative feedback loop of composite transistor 283.

Transistor 213 acts as an emitter-follower transistor (e.g., provides no voltage inversion) with respect to the path of the negative feedback loop of composite transistor 283. The negative feedback loop of composite transistor 283 is implemented, in part, by utilizing transistor 212 to supplement the operation of transistor 213. Particularly, while transistor 213 provides the output current at output 202, transistor 212 acts as a voltage inverting amplifier for the base drive of transistor 213 such that a voltage inversion occurs across transistor 212. As mentioned above, in the depicted embodiment of amplifier 200, transistor 212 is the only transistor utilized in composite transistor 283 that contains a voltage inversion characteristic. In inverting the signals passing through it, transistor 212 rotates the phase of the current signal entering the base terminal of transistor 213 by 90 degrees. Transistor 211 closes the negative feedback loop of composite transistor 283, thus preserving the phase of the loop's signal.

Transistor 213 may be any transistor in which performance enhancement is desireable. From this perspective, transistors 211 and 212, and circuits 220 and 225, improve the performance characteristics of transistor 213. Persons skilled in the art, however, will appreciate that transistor 213, when compared to an uncoupled and independent transistor 213, may be modified to emphasise particular performance charactertisits. In this manner, composite transistor 283 preferably operates similar to the operation of the transistor intended to be enhanced but realizes improved performance characteristics.

Figure 1A:
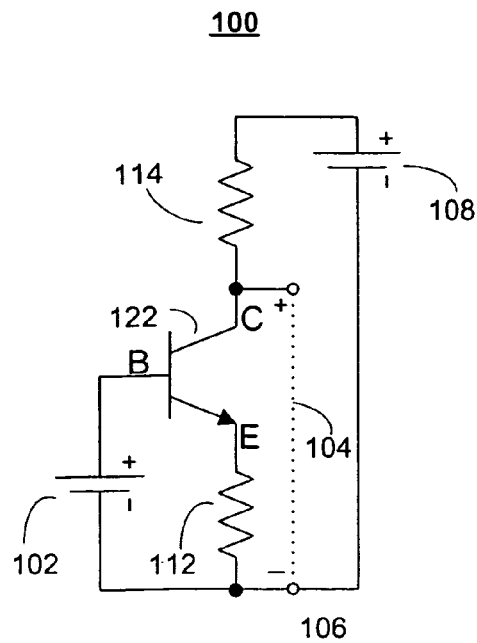
FIG. 1A is a schematic diagram of a prior art transistor voltage amplifier circuit.
Figure 1B:
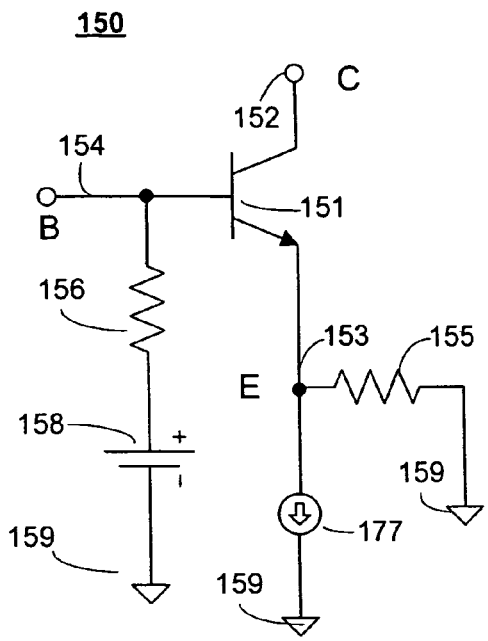
FIG. 1B is a schematic diagram of a prior art transistor current amplifier circuit.
Figure 1C:
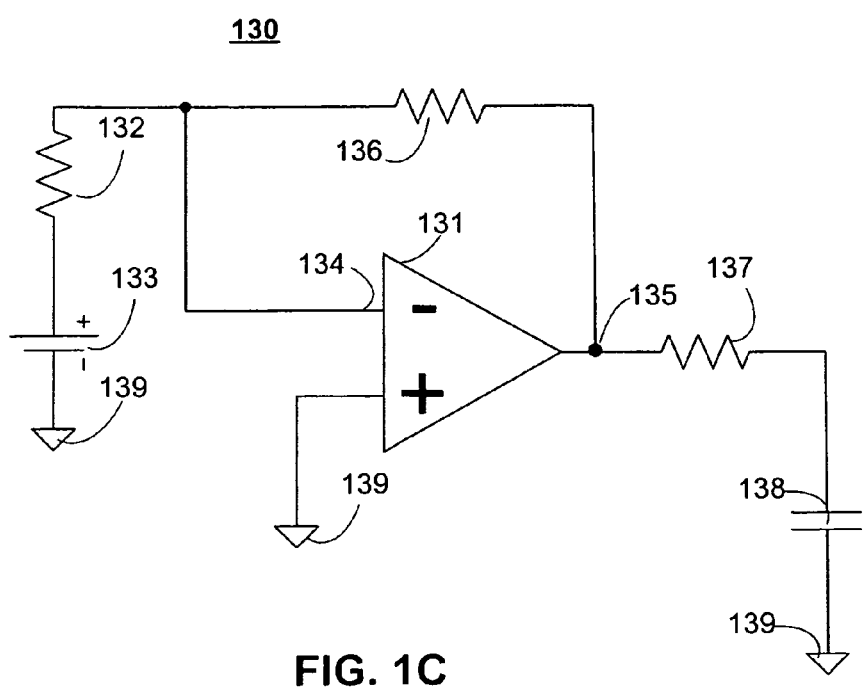
FIG. 1C is a schematic diagram of a prior art amplifier employing a negative feedback loop.

One such performance enhancement of composite transistor 283 is that reverse isolation in composite transistor 283 is large (when compared to the reverse isolation of amplifier 150 of FIG. 1B). Particularly, reverse isolation occurs because the base current of transistor 213 and the displacement current of the capacitance between the base and collector terminals of transistor 213 are effectively decoupled from input 201 due to the loop created by transistors 212 and 213.

Protection circuit 240 may be included in composite transistor 283 or amplifier 200. Protection circuit 240 includes transistor 241. Persons skilled in the art will appreciate that the signal from the negative feedback loop of composite transistor 283 preferably does not directly flow through transistor 241 because transistor 241 is outside the path of the negative feedback loop of composite transistor 283. Transistor 241 prevents the negative feedback loop of composite transistor 283 from turning positive. The negative feedback loop can turn positive in instances when transistor 212 saturates. As a result, transistor 241 prevents latch-up and malfunction of composite transistor 283.

Without transistor 241, latch-up of amplifier 200 is possible. Bias source 242 should be adjusted such that when the collector-to-emitter terminal voltage of transistor 212 goes LOW (e.g., 100 mV), transistor 241 will turn ON. In such instances, transistor 241 provides a saturation clamp for transistor 212 (e.g., prevents saturation of transistor 212).

Composite transistor 283 may also include feed-forward circuit 220. Feed-forward circuit 220 may be coupled, for example, across the emitter and collector terminals of transistor 211. Feed-forward circuit 200 primarily aids in preserving the signal phase of the negative feedback loop of composite transistor 283 at high frequencies (e.g., frequencies close to unity gain frequency of the negative feedback loop of composite transistor 283).

Preferably, feed-forward circuit 220 is constructed with capacitor 221 that is coupled between the collector terminal of transistor 211 at node 281 and the emitter terminal of transistor 213 at node 203. Feed-forward circuit 220 may also include resistor 223. Both resistor 213 and capacitor 221 tailor the frequency response of the negative feedback loop of the composite transistor 283 in instances close to frequency unity gain of the negative feedback loop of composite transistor 283. In this manner, resistor 223 and capacitor 221 provide compensation and loop stability by improving the phase margin of the loop at very high frequency poles (e.g., frequencies approximately equivalent to the unity frequency gain of composite transistor 283).

Amplifier 200 may also include bandwidth limiting circuit 225. Bandwidth limiting circuit 225 may include capacitor 222 and resistor 224 that are coupled in series between the base of transistor 213 and ground 299. By dimensioning the capacitance of bandwidth limiting circuit 225, the unity gain frequency of the composite transistor 283 may be established. More particularly, by increasing the capacitance of bandwidth limiting circuit 225, the unity gain frequency of negative feedback loop of the composite transistor 283 decreases, thus improving the phase margin of the negative feedback loop of composite transistor 283. However, increasing the capacitance of bandwidth limiting circuit 225 decreases the linearity of bandwidth limiting circuit 225 and the unity gain frequency of the negative feedback loop of composite transistor 283.

In this manner, dimensioning of the capacitance of bandwidth limiting circuit 225 may be dependent upon the application desired. For example, a suitable dimension of the capacitor 222 when composite transistor 283 is implemented in an intermediate frequency (IF) amplifier may be a dimension such that the unity gain frequency of amplifier 100 is stable for intermediate frequencies. In other words, the bandwidth of amplifier 200 can be tailored to suite applications requiring high linearity at different bandwidths. Persons skilled in the art will appreciate that capacitor 222 is preferably dimensioned to provide the dominant pole to the negative feedback loop of composite transistor 283 of amplifier 200 to aid in the establishment of the unity gain frequency of composite transistor 283.

Capacitor 222 also provides, at very high frequencies close to unity gain frequency of the negative feedback loop of the composite transistor 283, a resistive impedance that is seen in the emitter terminal of transistor 213 at contact 203.

This resistive impedance of the emitter terminal of transistor 213 prevents resonance between an otherwise inductive transistor 213 impedance and any capacitance present at the emitter terminal of transistor 213 (e.g., current source 252 output capacitance and the capacitance between the base and emitter terminals of transistor 211). As mentioned, resistor 224 may also be included in bandwidth limiting circuit 225. Similar to resistor 225, resistor 224 improves the frequency response and phase margin of the negative feedback loop of composite transistor 283.

The minimum complexity of composite transistor 283 and its integration into amplfier 200 preferably results in a unity gain frequency of amplifier 200 which is higher than 10% of the unity gain frequency of a single NPN transistor while maintaining stable (e.g., approximately 60 degree phase margin) operation. For signal frequencies at about 1% of the unity gain frequency of amplifier 200, the negative feedback loop of composite transistor 283 may, for example, preferably exhibit a large gain (e.g., 20 dB) and significantly improve the transconductance and input resistance of amplifier 200.

Many of the performance characteristics of amplifier 200 may be attributed to composite transistor 283. For example, the low operating voltage of amplifier 200 can be accredited to the principle that composite transistor 283 operates similar to a stand alone transistor. More particularly, the voltage at the base terminals of transistors 211, 212, and 213 are preferably equivalent. Thus, amplifier 200 can be constructed so that the,the base voltages of transistors 211, 212, and 213 are, for example, each approximately 0.8 volts and can operate at supply voltages (e.g., voltage source 208) as low as, for example, 1 volt.

Amplifier 200 also exhibits a high transconductance that is approximately equivalent to the inverse of the resistance of resistor 210 (e.g., $1/R_{210}$). This is because the transconductance of amplifier 200 is negligible,when resistor 210 is not included. As a result of this relatively high transconductance, amplifier 200 provides excellent linearity characteristics. Persons skilled in the art will appreciate that coupling voltage-to-current conversion resistor 210 to composite transistor 283 produces a voltage-to-current amplifier known as a transconducatance amplifier, the principles of which are utilized by amplifier 200.

Composite transistor 283 is preferably constructed such that its transconductance and transresistane is negligible when viewed from the perspective of amplifier 200. More particularly, when resistor 210 is added to amplifier 200, the characteristics of composite transistor 283 allow the voltage across resistor 281 to be approximately equivalent to the voltage supplied at input 201 (minus the base-to-emitter voltage of transistor 211). Thus, when resistor 210 is coupled to composite transistor 283 (e.g., coupled to node 203), resistor 210 becomes the primary source of transconductance for amplifier 200

Persons skilled in the art will appreciate that the resistance of resistor 210 can be reduced at least to the resistance of the base terminal of transistor 211. In this manner, the surface area of transistor 211 can be increased to reduce noise (as described above) and, at the same time, decrease the resistance of resistor 210. Because the transconductance of amplifier 200 can be approximately modeled to the equation $1/R_{210}$, decreasing the resistance of resistor 210 increases the gain and linearity of amplifier 200.

Persons skilled in the art will appreciate that the common terminal configurations of the transistors present in amplifier 200 can be replaced by other common terminal configurations. Doing so may allows amplifier 200 or composite transistor 283 to migrate to a variety of different devices that have a need for enchanced linearity, gain, or frequency response characteristics.

Figure 4:
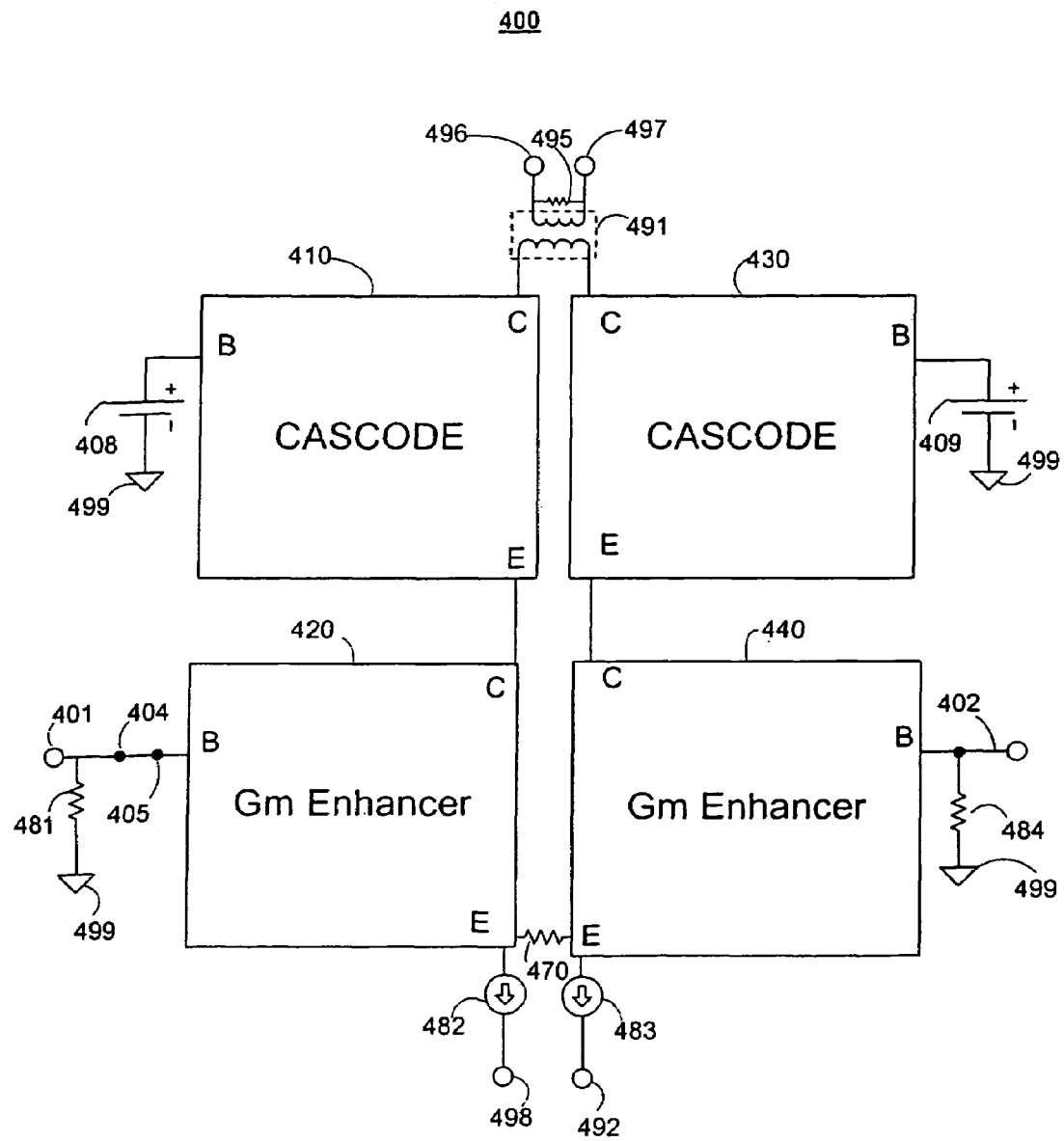
FIG. 4 is a simplified schematic diagram of a particular embodiment of a one-stage, enhanced composite amplifier cascaded with a cascode amplifier circuit, constructed in accordance with the principles of the present invention.

Persons skilled in the art will also appreciate that amplifier 200 may be included in a variety of different topologies such as a cascaded amplifier (e.g., amplifier 400 of FIG. 4). In such an embodiment, resistor 210 may be removed, embodied by the resistance seen in the connecting stages, or included in connection outside of amplifier 200. In part, resistor 210 responds to input voltages at input 201 by producing a highly linear output current at output 202. Additionally, persons skilled in the art will also appreciate that NPN composite transistor 283 of amplifier 200 can be congifured to have a PNP topology.

For signals with voltage swings greater than approximately 1 $V_{BE}$ of a stand alone transistor, a signal attenuation circuit may also be coupled to the input of amplifier 200, thus lowering the input voltage of amplifier 200. Moreover, composite transistor 283 may be utilized in an attenuator circuit, or any other device, and is not limited to amplification devices.

Persons skilled in the art will appreciate that current source 252 preferable has a relatively low output capacitance (when compared to amplifier 150 of FIG. 1B) and can be utilized to switch amplifier 200 ON and OFF. Low output capacitance allows amplifier 200 to be turned off when a low power mode is needed. An example of where a low power mode may be included is in amplifier 400 of FIG. 4. The functionality of a low power mode will be discussed further below.

Voltage source 251 is another biasing element to amplifier 200 and can be connected to the emitter terminal of transistor 212. Persons skilled in the art will additionally appreciate that amplifier 200 is not limited to a voltage-to-current transconductance amplifier. Amplifier 200 may be constructed as any type of amplifier (e.g., a current-to-voltage amplifier).

Figure 3:
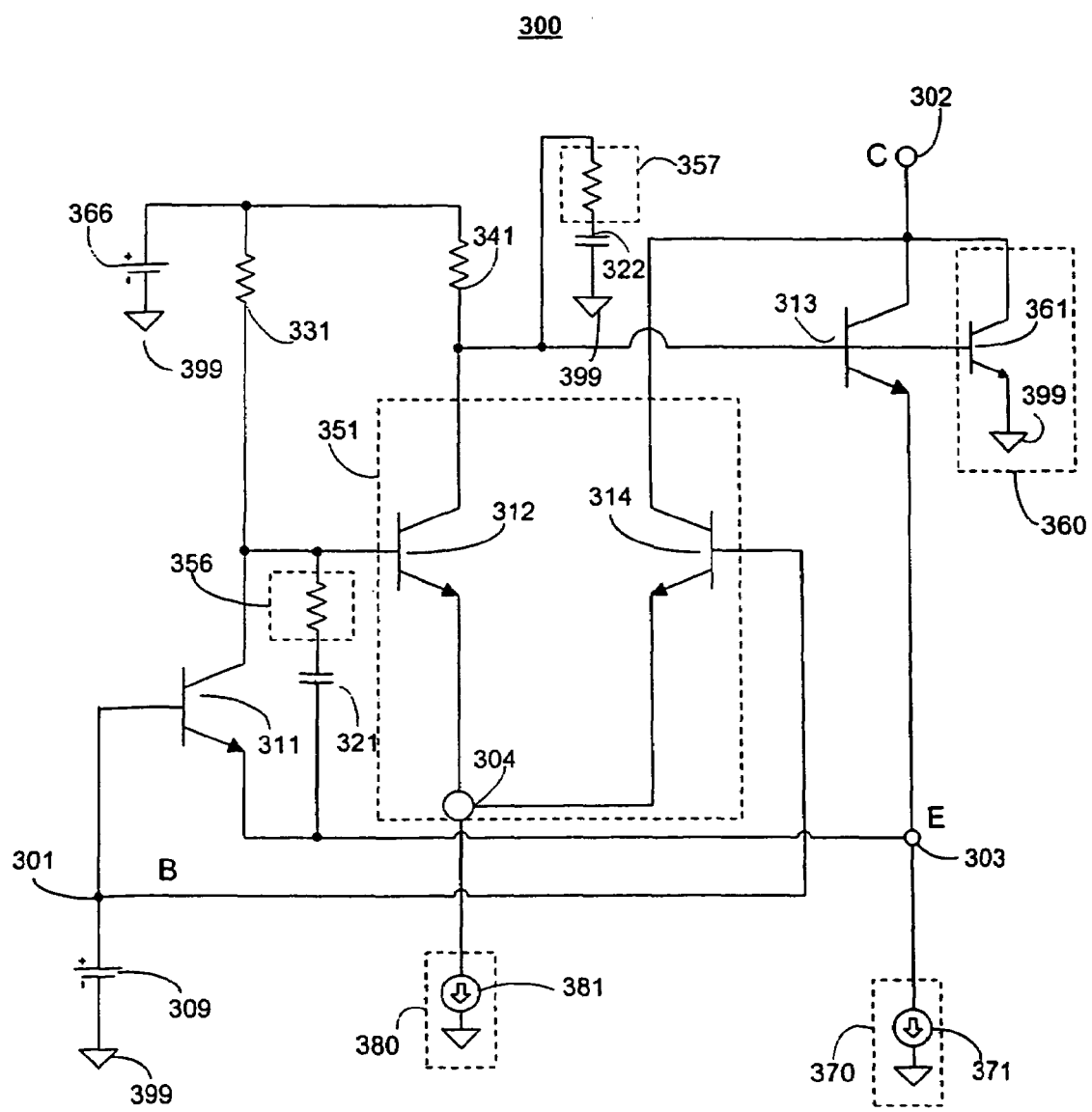
FIG. 3 is a schematic diagram of a grounded input active cascode amplifier constructed in accordance with the principles of the present invention.

FIG. 3 shows a schematic diagram of grounded input active cascode amplifier 300 employing a dual signal pass and constructed in accordance with the principles of the present invention. Amplifier 300 is similar to amplifier 200 of FIG. 2 and includes a composite transistor. The composite transistor of amplifier 300 includes transistors 311–314. Transistors 311, 312, and 314 enhance transistor 313 similar to how transistors 211 and 212 of FIG. 2 enhance transistor 213 of FIG. 2.

One difference from amplifier 200 of FIG. 2 is that cascode amplifier 300 preferably includes a primary current input at primary input 303 (e.g., the emitter terminal of transistor 313) and a secondary current input at secondary input 304 (e.g., the emitter terminal of transistor 314). The output of the primary current signal path is present at the collector terminal of transistor 313 at output 202. The output of the secondary current signal path is also present at the collector terminal of transistor 314 at output 202. Because the collector terminal of transistor 313 and the collector terminal of transistor 314 are coupled together at output 302, both current signal paths may be viewed as having a common output (e.g., dual signal pass). Persons skilled in the art will appreciate that cascode amplifier 300 preferably is constructed to provide a large voltage gain with minimal current gain.

Another difference between the composite transistor of amplifier 300 and the composite transistor of amplifier 200 of FIG. 2 is that amplifier 300 includes a differential pair of transistors (e.g., differential circuit 351) instead of an inversion transistor (e.g., transistor 212 of FIG. 2). Circuit 351 returns the current at the base terminal of transistor 313, including the displacement current of the collector-base capacitance of transistor 313, to output 302. As a result of the above operation, the primary input current at primary input 303 and the output current at output 302 is preferably equal. Without circuit 351, the output current at output 302 would be the difference between the input current at primary input 303 and base current of transistor 313 and will lead to a distorted output signal. Thus a cascode amplifier (e.g., same input and output current) is produced. Differential circuit 351 is preferably biased by resistor 341 that behave as a current source due to voltage source 366.

Furthermore, differential circuit 351 is employed to compensate the current located at the base of transistor 313. Differential circuit 351 increases the power present at the collector of transistor 313 because the collector current is reusing the DC current introduced into differential circuit 351. Additionally, differential circuit 351 is included in the negative feedback loop of the composite transistor of amplifier 300 to provide the inverting point of the loop (e.g., similar to transistor 212 of FIG. 2) and increases the transconductance of transistor 311.

The current at the base terminal of transistor 312 is preferably equal to the sum of the input currents at primary input 303 and secondary input 304 divided by the beta factor of transistor 312 and is essentially the collector current of transistor 311 when resistor 331 is as an ideal current source. The base terminal of transistor 311 is coupled to voltage source 309, while the emitter terminal of transistor 311 is coupled to primary input 303. The current at the collector terminal of transistor 311 is reduced by the operation of differential amplifier 351 such that the base-emitter voltage of transistor 311 does not have much signal variation when a current signal is present at the primary input 303. As a result, the bias voltage of voltage source 309, which is essentially an AC ground point, is impressed on primary input 303 (minus the $V_{BE}$ drop of transistor 311). Thus, primary input node 303 has a virtual ground behavior because very small voltage variation, if any, occurs at primary input 303. In this manner, a grounded input cascode amplifier is constructed.

Persons skilled in the art will appreciate that a second virtual ground also may be provided at the base terminal of transistor 314 because the voltage at the base terminal of transistor 314 is stabilized by supply voltage 309 because a very small voltage variation, if any, is present at node 301. The base terminals of transistors 314 and 311 are coupled to supply voltage 309. In one preferred embodiment, supply voltage 309 may be, for example, 2.1 volts.

Persons skilled in the art will further appreciate that the base terminals of transistors 314 and 311 can be supplied voltages at different voltage levels to modify the performance characteristics of amplifier 300. Persons skilled in the art will also appreciate that preferably the emitter terminals of transistors 311, 312, 313, and 314 are at approximately the same voltage (e.g., at the same DC bias).

The bias elements of cascode amplifier 300 are the DC value of current 381, the DC value of current 371, the voltage values of sources 366 and 309, and the resistive values of resistor 331 and 341. In preferred embodiments, the biasing elements of cascode amplifier 300 are biased such that the DC voltage at primary input 303 and secondary input 304 are equal. Persons skilled in the art, however, will appreciate that the voltages present at primary node 303 and secondary node 304 may be different.

As stated, primary input 303 includes the attributes of a virtual ground with a voltage equivalent to $V_{309} - V_{311BE}$. In establishing a constant voltage at primary input 303, amplifier 300 may be utilized to power devices external to cascode amplifier 300. For example, the virtual ground qualities of primary input 303 may be used to power an amplifier cascaded together with cascode amplifier 300.

For example, amplifier 200 of FIG. 2 may be cascaded with amplifier 300 of FIG. 3 at primary input 303 and replace bias circuitry 370 (as show in amplifier 400 of FIG. 4) such that amplifier 300 provides a bias voltage to amplifier 200. In such an embodiment, amplifier 200 would provide a bias current to amplifier 300 and, as a result, eliminate the need for bias source 370.

As per another example, amplifier 200 of FIG. 2 may be cascaded with amplifier 300 of FIG. 3 at secondary input 304 and replace bias circuitry 380 (as show in amplifier 1300 of FIG. 13) such that amplifier 300 provides a bias voltage to amplifier 200. In such an embodiment amplifier 200 would provide a bias current to amplifier 300 and, as a result, eliminate the need for bias source 380. Secondary input 304 may also exhibit the properties of a virtual ground node.

As discussed above, biasing circuitry 380 can be utilized to increase the current that is compensated at the base of transistor 313 and as a second input source. Biasing circuit 380 preferably is a DC current tail source for differential circuit 351 and, at the same time, is a signal current source for transistor 314. Circuit 380 may be replaced by another device such as a control device or amplifier. As mentioned above, circuit 380 may be the output node of a voltage-to-current amplifier similar to amplifier 200 of FIG. 2. When the base current of transistor 313 is compromised by an appropriate current from circuit 380, the gain of amplifier 300 increases (e.g., preferably a 1.5 dB step gain).

Transistors 313 and 312 provide current gain for amplifier 300. Particularly, the current gain $B_{313}$ of transistor 313 and the current gain $B_{312}$ of transistor 312 provides a total current gain $IA_{300}$ for the negative feedback loop of the composite transistor of amplifier 300 as follows:

$$IA_{300} = B_{313}(B_{312})$$

Persons skilled in the art will appreciate that $IA_{300}$ is a rough approximation of the loop current gain at low frequencies and frequencies going up to the unity gain frequency divided by the DC current gain of a stand alone NPN transistor constructed in accordance with the principles of the present invention.

Feed-forward circuit 321 and bandwidth limiting circuit 322 exhibit characteristics similar to feed-forward circuit 221 and bandwidth limiting circuit 222 of FIG. 2, respectively. Similar to amplifier 200, amplifier 300 preferably exhibits a voltage headroom of the base-to-emitter voltage of a stand alone transistor in an active mode (e.g., transistor 313 uncoupled and operating independent from amplifier 300) constructed in accordance with the principles of the present invention. Particularly, the output voltage swing of transistor 314 and transistor 313 may have a lower boundary defined by the saturation points of transistors 313 and 314 and an upper boundary defined by the breakdown mechanism of transistors 314 and 313. Persons skilled in the art will appreciate that additional circuitry 356 and 357 may be coupled to resistors 321 and 322, respectively, in order to control the AC response of the negative feedback loop of circuit 300 around unity gain frequency of the negative feedback loop.

If a higher current gain for amplifier 300 is desired, gain enhancing circuit 360 may be included. Preferably, gain enhancing circuit 360 includes transistor 361 and an appropriate current gain source with virtual ground properties. As included in amplifier 300, transistor 361 and 313 both have emitter terminals at a virtual ground; the combination of these transistors preferably behaves as a current mirror amplifier. In this manner, the output current signal at output 302 will be greater than the current signal at primary input 303 by a factor approximately equal to the area ratio of transistors 361 and 313 (e.g., $Area_{361}/Area_{313}$). Thus, the gain of transistor 313 is enhanced by the area ratio of the two transistors.

Persons skilled in the art will appreciate that additional gain enhancing elements and circuits can be added to or modified in amplifier 300 in accordance with the principles of the present invention. For example, a second gain enhancement circuit (not shown) can be added to amplifier 300 by including an additional transistor with a collector terminal coupled to the collector terminal of transistor 361 and an emitter terminal coupled to ground 360.

Amplifier topologies 200 and 300 from FIGS. 2 and 3, respectfully, can be migrated and cascaded together to realize cascaded amplifier 400 of FIG. 4. Generally, amplifier 400 is constructed to take voltage signals located at inputs 401 and 402 and amplify these signals to produce an output at transformer 491 to power load 495. In powering load 495, a voltage differential is located across load 495 at nodes 496 and 497 that is representative of the amplified output signal created by amplifier 400.

Cascaded amplifier 400 preferably includes a transconductance enhancing differential amplifier (including enhanced devices 420 and 440) and an active cascode grounded input differential amplifier (enhanced devices 410 and 430). Enhanced devices 420 and 440 are each constructed in accordance with the same principles of amplifier 300 of FIG. 3. Similarly, enhanced devices 410 and 430 are each preferably constructed in accordance with the principles of amplifier 200 of FIG. 2.

Persons skilled in the art will appreciate that the bias currents presented by sources 482 and 483 are used in part, to bias enhanced devices 410, 420, 430, and 440. Additionally, power sources 408 and 409 form virtual grounds nodes (e.g., 1.3 volts) at the inputs of enhanced devices 410 and 430 that are used to provide voltage bias to enhanced devices 420 and 440 via the output nodes of enhanced devices 420 and 440. Thus, amplifier 400 consumes a low amount of power because the differential amplifiers are not biased by separate sources. In this manner, though amplifier 400 includes two differential amplification levels, amplifier 400 actually operates as a one stage amplifier.

For amplifier 400 to operate as a two-stage amplifier, the two differential amplifiers would need to be biased independently. Persons skilled in the art, however, will appreciate that the enhanced devices of amplifier 400 may be biased separately in order to create a two-stage amplifier.

The gain of enhanced devices 420 and 440 is dependent on the negative feedback loop affected, in part, by resistor 470 and current sources 482 and 483. By controlling the currents that are introduced into enhanced devices 420 and 440, the operation of these devices can be manipulated. Additionally, signals introduced at DC bias nodes 492 and 498 can affect the operation and performance of enhanced devices 420 and 440 (e.g., DC bias node 492 and 498 can manipulated by a bias in a manner similar to the affect of circuit 370 of FIG. 3 on amplifier 300). Furthermore, by including a stable bias at nodes 492 and 498, the impedance at that emitter of first cascade stage 420 is maximized.

As mentioned above, enhanced devices 410 and 430 are connected to enhanced devices 420 and 440, respectively, at a virtual ground contact. As a result, enhanced devices 410 and 430 provide substantially no frequency response to enhanced devices 420 and 440, and enhanced devices 420 and 440 provide substantially no frequency response to enhanced devices 410 and 430. Amplifiers (e.g., enhanced devices) that exhibit frequency response from one stage to another generally have a decreased unity gain frequency compared with those that do have a frequency response occurring from one stage to another.

Persons skilled in the art will appreciate that resistor 470 can be used to control the transconductance of amplifier 400. Generally, the transconductance of amplifier 400 can be defined as the ratio of the resistance of load 495 over the resistance of resistor 470. More particularly, amplifier 400 is constructed such that the amount of current entering resistor 470 is equivalent to $V_{401-402}/R_{470}$. Enhanced devices 410 and 430 do not perform current amplification. Because the difference between the voltages of inputs 401 and 402 ($V_{401-402}$) is generally present across resistor 470, a transconductance conversion factor can be seen at resistor 470. As a result, the current and output levels between outputs 496 and 497 generally can be defined as follows:

$$I_{496-497} = V_{401-402}/R_{470}$$

$$V_{496-497} = (V_{401-402}/R_{470})(R_{495}*N_{491})$$

$N_{491}$ is the impedance ration of transformer 491. Because voltage gain of amplifier 400 is $V_{496-497}/V_{401-402}$, the voltage gain of amplifier 400 is generally equivalent to $(R_{495}*N_{491})/R_{470}$. Voltage gain for amplifier 400 may be, for example, 20 dB. Power gain for amplifier 400 may be, for example, 32 dB when $(R_{495}*N_{491})$ is approximately 200 ohms and $R_{470}$ is approximately 3.3 ohms.

Persons skilled in the art will appreciate that, depending on the application of amplifier 400, resistor 420 may be a variable resistor such that the transconductance of amplifier 400 can be changed during operation.

As mentioned above, enhanced devices 410, 420, 430, and 440 are preferably constructed to have a small voltage headroom when compared to transistor 150 of FIG. 1B. The reduced headroom decreases the amount of power needed to power amplifier 400. Furthermore, the reduced headroom allows the capacitors of amplifier 400 to be constructed with relatively low capacitances because amplifier 400 operates at a higher frequency.

Persons skilled in the art will also appreciate that in instances where low power modes are desirable, the amplifiers of circuit 400 can be turned ON (e.g., enabled) and OFF (e.g., unenabled). More particularly, enhanced devices 430 and 440 may be turned OFF such that only enhanced devices 410 and 420 amplify the input to contact 401. Doing so decreases the power needed to operate amplifier 400. Enhanced devices 430 and 440 may be turned OFF, for example, by setting the bias current at current source 483 to zero. Enhanced devices 410 and 420 may be turned-OFF, for example, by setting the bias current at current source 482 to zero.

Persons skilled in the art will further appreciate that a third or more level of differential enhanced device levels may be added to amplifier 400. Particularly, enhanced devices can be added to the input of enhanced devices 420 and 440 or enhanced devices can be added to the input of enhanced devices 410 and 430. An example of an amplifier with two transconductance enhancing differential amplifier levels is discussed below in connection with the discussion of amplifier 1300 of FIG. 13.

Persons skilled in the art will appreciate that transformer 491 may include a center tap that is powered by an external voltage source. This voltage source may then provide a voltage supply to amplifier 400 and also may provide bias tail currents to enhanced devices 410, 430, 420, and 440.

Figure 5:
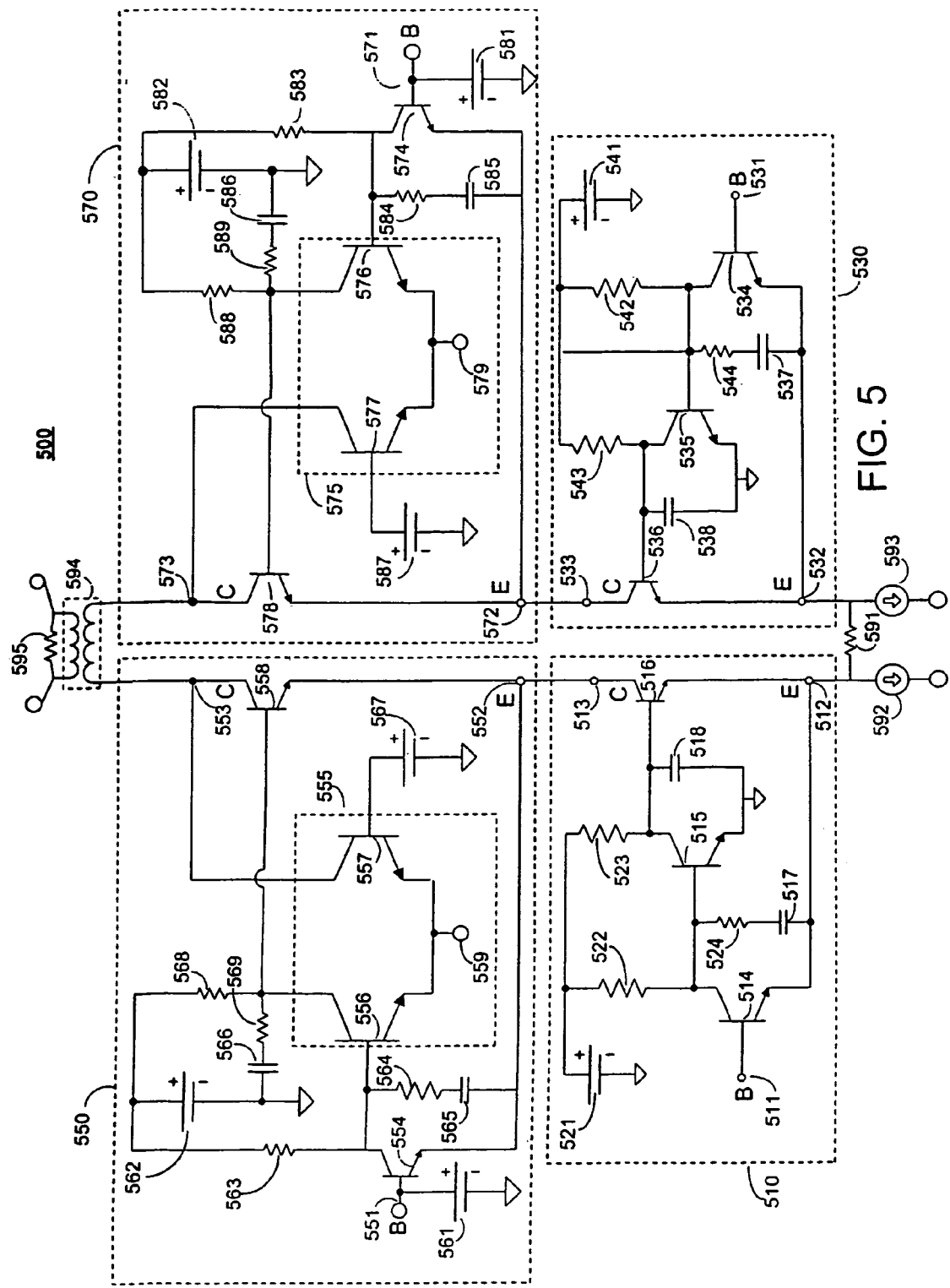
FIG. 5 is a schematic diagram of the amplifier of FIG. 4 constructed in accordance with the principles of the present invention.

FIG. 5 illustrates amplifier 500, which is a component level version of amplifier 400 of FIG. 4. Enhanced devices 510 and 530, correspond to enhanced devices 420 and 440 of FIG. 4, respectively. Enhanced devices 550 and 570 correspond to enhanced devices 410 and 430, respectively.

Enhanced devices 510 and 530 in FIG. 5 are similar to amplifier 200 of FIG. 2. In amplifier 200, the input signal is fed into the base terminal 201 of transistor 211. This corresponds to base terminal 511 of transistor 514 and base terminal 531 of transistor 534. Meanwhile, resistor 223 and capacitor 221, which are shown in FIG. 2 as coupled between the collector and emitter terminals of transistor 211, correspond to resistor 524 and capacitor 517 and resistor 544 and capacitor 537 found in enhanced devices 510 and 530, respectively. Similarly, resistors 231 and 232 in amplifier 200 correspond to resistors 522 and 523 and resistors 542 and 543 in enhanced devices 510 and 530, respectively.

Moreover, transistors 515 and 535, and transistors 516 and 536, correspond to transistors 212 and 213 of FIG. 2, respectively. Capacitor 222, which is shown in FIG. 2 to be coupled between the base terminal of transistor 213 and the emitter terminal of transistor 212, corresponds to capacitors 518 and 538 in enhanced devices 510 and 530, respectively. Resistor 224 of FIG. 2, however, has been excluded from enhanced devices 510 and 530. Nevertheless, it should be understood that the invention is not limited in this manner, and that FIG. 5 is only presented for the purpose of illustration.

In a preferred embodiment, two instances of resistor 224 of FIG. 2 may be included in amplifier 500. Namely, resistor 224 may be coupled between capacitor 518 and the base terminal of transistor 516 (forming a first RC circuit as shown in FIG. 2), and resistor 224 may be coupled between capacitor 536 and the base terminal of transistor 536 (forming a second RC circuit as shown in FIG. 2)

Furthermore, it should be understood that voltage source 521 and voltage source 541 correspond to voltage source 208 shown in FIG. 2. It should also be understood that similarly to amplifier 200, in which the output is taken at the collector terminal 202 of transistor 213, the outputs of enhanced devices 510 and 530 are taken, respectively, at the collector terminal 513 of transistor 516 and the collector terminal 533 of transistor 536. Moreover, the emitter terminals 512 and 532 of enhanced devices 510 and 530, respectively, correspond to emitter terminal 203 shown in FIG. 2.

As shown in FIG. 5, base terminal 551 of transistor 554 and base terminal 571 of transistor 574 are respectively supplied with voltage sources 561 and 581. This corresponds to voltage source 309 in FIG. 3, which is coupled to the base terminal 301 of transistor 311. Similarly, differential transistors 312 and 314 of FIG. 3 correspond to transistors 556 and 557 of enhanced device 550 and transistors 576 and 577 of enhanced device 570. As shown, these transistor pairs make up components 555 and 575, respectively, in enhanced devices 550 and 570.

Moreover, as shown in FIG. 5, voltage source 309 of FIG. 3 corresponds to voltage sources 561 and 567 in enhanced device 550 and voltage sources 581 and 587 in enhanced device 570. It should be understood that voltage sources 561 and 567, or voltage sources 571 and 581, may be a single voltage source instead of two as shown in FIG. 5. Meanwhile, capacitor 321 of FIG. 3 corresponds to capacitors 565 and 585 in stages 550 and 570, respectively. Additionally, resistors 563 and 568 are powered by voltage source 562 in enhanced device 550 and resistors 583 and 588 are powered by voltage source 582 in enhanced device 570 similar to the manner in which resistors 331 and 341 of FIG. 3 are powered by voltage source 366 of FIG. 3.

Further comparisons exist in that capacitor 322 and transistor 313 of FIG. 3 correspond to capacitor 566 and transistor 558 in enhanced device 550 and to capacitor 586 and transistor 578 in enhanced device 570. It should also be noted that the collector terminals of transistors 558 and 578 provide outputs terminals 553 and 573.

Amplifier 500 includes cascode enhanced devices 550 and 570 which do not incorporate gain enhancing circuit 360 shown in FIG. 3. It should be understood, however, that the invention is not limited in this manner. Gain enhancing circuit 360 may be added to amplifier 500 without departing from the scope of the principles of the present invention.

Persons skilled in the art will appreciate that the emitter terminals of transistors 556 and 557 may be preferably connected to an enhanced device similar to enhanced device 510. More particularly, a second instance of enhanced device 510 may be included in amplifier 500 such that a node 513 (e.g., the output current node) of the second instance of enhanced device 510 is coupled to the emitter terminals of transistors 556 and 557 at node 559. The voltage input of this second instance of enhanced device 510 may be coupled to input 511 (e.g., both inputs 511 may be coupled together). Doing so creates a secondary current path in enhanced device 550, the functionality and benefits of which are described and shown further in amplifier 1300 of FIG. 3.

Similarly, persons skilled in the art will appreciate that the emitter terminals of transistors 576 and 577 may be preferably connected to an enhanced device similar to enhanced device 530. More particularly, a second instance of enhanced device 530 may be included in amplifier 500 such that a node 533 (e.g., the output current node) of the second instance of enhanced device 530 is coupled to the emitter terminals of transistors 576 and 577 at node 579. The voltage input of this second instance of enhanced device 530 may be coupled to input 531 (e.g., both inputs 531 may be coupled together). Doing so creates a secondary current path in enhanced device 570, the functionality and benefits of which are described and shown further in amplifier 1300 of FIG. 3. Persons skilled in the art will also appreciate that enhanced devices 530 and 570 may be removed, or selectively turned OFF, from amplifier 500. Doing so removes the differential operation of amplifier 500, which is particularly beneficial when it is only desired that a single voltage signal is to be amplified. In selectively turning enhanced devices 530 and 570 OFF (e.g., turning current source 593 OFF), a low-power mode may be realized in amplifier 500.

Figure 6:
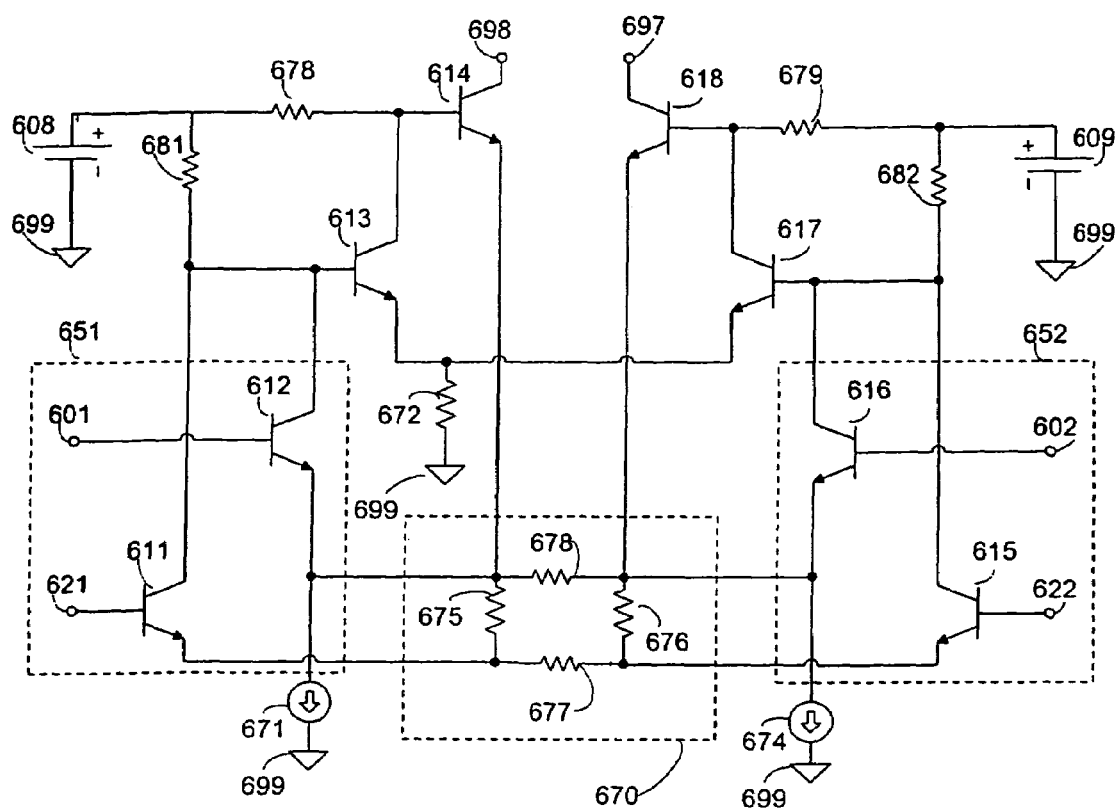
FIG. 6 is a schematic diagram of a variable gain amplifier circuit constructed in accordance with the principles of the present invention.

Another particular embodiment for enhanced devices 510 and 530 of FIG. 5 is illustrated by variable gain differential amplifier 600 of FIG. 6. One difference between amplifier 500 and 600 may be, for example, that transistor 511 of FIG. 5 is replaced by two transistors that share the same collector terminal in amplifier 600 (e.g., transistors 611 and 612 for variable gain stage 651 and transistors 615 and 616 for variable gain stage 652). Thus, amplifier 600 introduces the principle of a dual input selectable gain amplifier.

Generally, amplifier 600 is configured to allow multiple gains to be realized in amplifier 600 depending upon which of the two gain transistors of a gain stage (e.g., stage 651 and 652) are active (e.g., ON). For example, depending on which of transistors 611 and 612 is ON in gain control stage 651, amplifier 600 will exhibit different gain characteristics (e.g., the transconductance of amplifier 600 will preferably be different).

In a preferred embodiment, transistor 611 will be in the same state as transistor 615. Similarly, transistor 612 will preferably be in the same state as transistor 616. In this manner, amplifier 600 will have an output current at outputs 698 and 697 that is either the voltage difference between inputs 621 and 622 or the voltage difference between inputs 601 and 602 with respect to the resistance seen in resistive network 670. Persons skilled in the art will appreciate, however, that transistors 611 and 612 may be switched differently than transistors 615 and 616, respectively. In doing so, more than two differential operations can be performed by amplifier 600.

If transistors 611 and 615 are ON, the current gain at output nodes 697 and 698 is preferably as follows:

$$I_{698-697} = V_{621-622} / [((R_{675}+R_{676}+R_{677})/R_{677})/(R_{678} \| (R_{675}+R_{676}+R_{677}))]$$

when $R_{676}$ and $R_{675}$ have the same resistance. Persons skilled in the art will appreciate that resistors 676 and 675 should preferably have the same resistive value in order to keep differential amplifier 600 symmetrically balanced. If transistors 612 and 616 are ON, the current gain at output nodes 697 and 698 is preferably as follows:

$$I_{698-697} = V_{601-602} / [(R_{678} \| (R_{675}+R_{676}+R_{677})]$$

when the resistors $R_{676}$ and $R_{675}$ have the same resistance. Thus, persons skilled in the art will appreciate that depending on which of transistors 611, 612, 615, and 616 are ON, a different resistive array is seen by the perspective of the output current ($I_{698-697}$) of differential amplifier 600.

Furthermore, persons skilled in the art will appreciate that resistors 681 and 682 operate similarly to, for example, resistors 522 and 523, and resistors 542 and 543, respectively, of FIG. 5. Voltage sources 608 and 609 may operate similarly to, for example, voltage sources 521 and 541 of FIG. 5, respectively. Moreover, transistors 613 and 617 may operate similarly to, for example, transistors 515 and 535 of FIG. 5, respectively, and transistors 614 and 618 may operate similarly to, for example, transistors 516 and 536 of FIG. 5, respectively.

Persons skilled in the art will also appreciate that the feed-forward loops (e.g., the loop including resistors 524 and capacitor 517 of FIG. 5) constructed in accordance with the principles of the present invention may be included in amplifier 600. Similarly, the bandwidth limiting circuit (e.g., capacitor 518 of FIG. 5) and other performance enhancing circuits constructed in accordance with the principles of the present invention may be included in amplifier 600. Additionally, transistors 612 and 616 are preferably coupled to current sources 671 and 674, respectively.

Persons skilled in the art will appreciate that no transistors are present in the output current path of amplifier 600. As a result, minimum capacitive loading of resistive network 670 is realized, thus providing minimum linear degradation.

In a preferred embodiment, resistor network 670 is preferably constructed such that resistors 675, 676, and 677 are fabricated with a different material then the material employed to fabricate resistor 678. As a result, the precision of the resistance for resistor network 670 is smaller than a single resistor with the same resistance as resistor network 670. Similarly, if a portion of resistor network 670 is utilized in a series or parallel resistor configuration, and if that portion of network 670 contains two or more resistors fabricated with different materials, than the overall tolerance of that portion of network 670 is narrowed.

As an example, if a resistor has a resistance of 1,000 ohms and a tolerance of 10%, that resistor may actually model a resistance between 900 and 1,100 ohms. However, if the resistor is a resistor network (e.g., resistor network 670) employing resistors fabricated with different materials, resistor network 670 may, for example, have a resistive precision of approximately 7% while the tolerance of each individual resistor included in resistive network 670 is 10%. More particularly, when resistive network 670 is seen, for example, by outputs 698 and 697 as two resistors in parallel (e.g., resistor 678 and resistor 675 in parallel) than the tolerance of these two resistors will be as follows:

$$Tolerance_{R675,R678} = sqrt[(Tolerance_{675} * R_{675} / R_{R675,R_{R678}})^{\wedge}2 +$$

$$(tolerance_{678} * R_{678} / R_{R675,R_{R678}})^{\wedge}2]$$

Taking the example where these two resistors are not correlated and the tolerance of each separate resistor is 10%, the total tolerance achieved by fabricating the resistors with a different material is equivalent to sqrt[(10*0.5)^2+(10*0.5)^2] which is equivalent to 10/sqrt(2) or 7%. As shown, employing transistor array 670 into an amplifier in accordance with the principles of the present invention can lower the tolerance of the resistors the amplifiers are constructed with. Materials that may be used to fabricate resistor network 670 may be for example titan-nitride resistors and n-type polysilicon. Particularly, resistor 678 may be a polysilicon (e.g., n-type or p-type polysilicon) while resistors 675, 676, and 677 may be titan-nitride resistors.

Persons skilled in the art will appreciate that resistor network 670 can be employed with any combination of resistors in a series configuration, parallel configuration, or any combination thereof. Furthermore, persons skilled in the art will appreciate that if the a composite,resistor constructed with two resistors are fabricated to have opposite temperature coefficients (e.g., one resistor has a positive temperature coefficient and the second resistor has a negative temperature coefficient) then the combination will have an improved temperature coefficient. Persons skilled in the art will appreciate that resistor network 670, and the temperature and tolerance benefits thereof, may be useful in a wide variety of applications not limited to, amplification and attenuation circuits.

Persons skilled in the art will also appreciate that amplifier 600 may have more than two variable gains. For example, a third variable gain stage can be added to amplifier 600.

Figure 7:
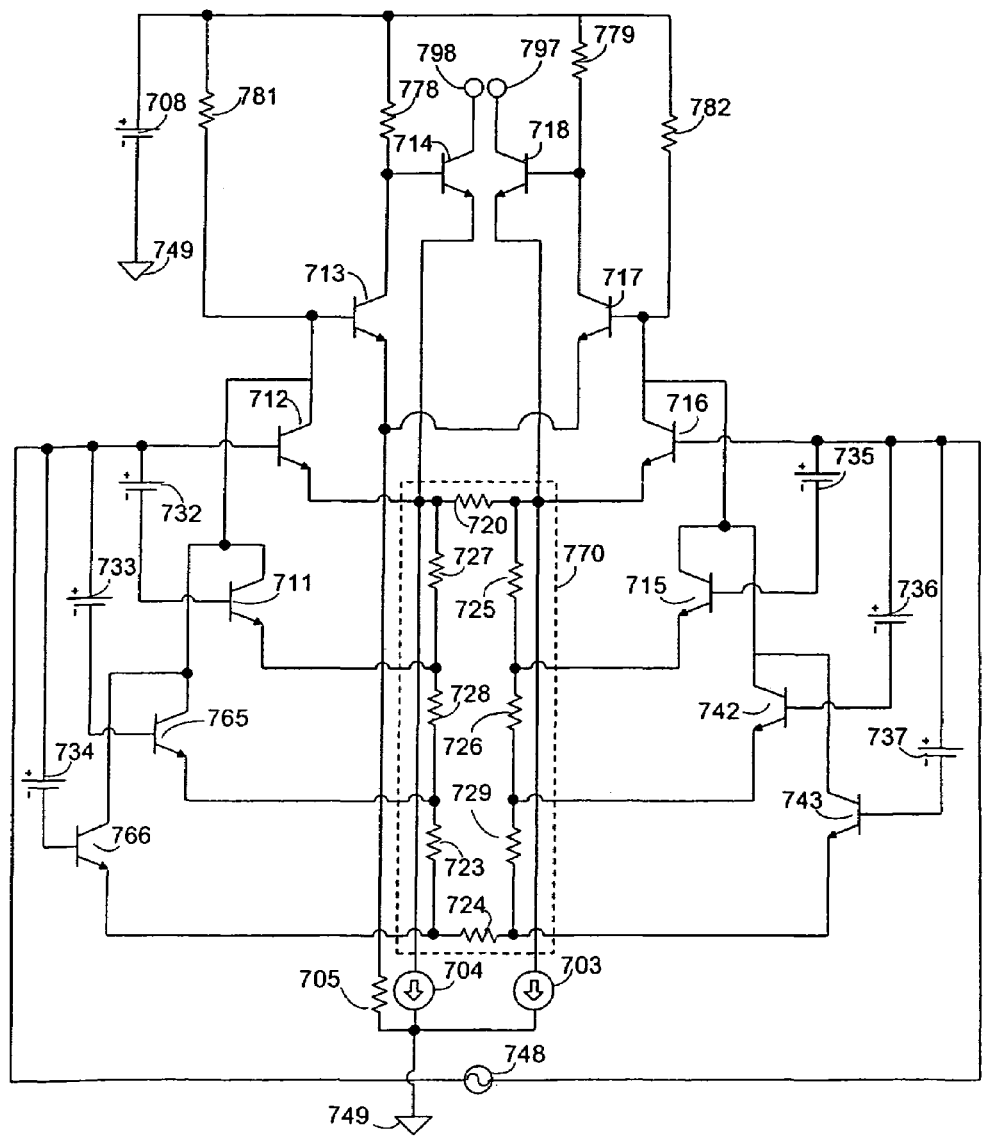
FIG. 7 is a schematic diagram of a variable gain amplifier circuit constructed in accordance with the principles of the present invention.

FIG. 7 shows an amplifier 700 which is similar to circuit 600 of FIG. 6. Amplifier 700, however, is constructed to include additional gain stages when compared to amplifier 600 of FIG. 6. More particularly, circuit 700 is constructed with four general variable gain stages. Depending on which of transistors 711–713, 765, 766, 715–717, 742, and 743 are ON, different current paths are created to outputs 798 and 797. Thus, the gain of amplifier 700 will change as different resistances in resistor network 770 are realized for these variable current paths.

Persons skilled in the art will appreciate that many of the 7XX components of amplifier 700 are similar to the 6XX components of FIG. 6. Particularly, 7XX components are preferably constructed in accordance with the same principles as 6XX components where XX is the same reference numeral. Persons skilled in the art will appreciate, however, that some variations may exist between the components of amplifier 700 and amplifier 600 of FIG. 6. For example, resistors 778, 779, 781, and 782 are coupled to a single voltage source, voltage source 631. In amplifier 600 of FIG. 6, however, resistors. 678 and 681, and resistors 679 and 682 are coupled to two voltage sources, voltage sources 608 and 609, respectively.

As stated, depending on which combination of transistors are ON in amplifier 700, current can flow in any one of several paths formed from resistors 720 and 723–729 of resistive network 770. In other words, different transconductances can be realized in circuit 700 depending on which resistor path is formed by resistive network 770 with respect to the transistors of FIG. 7 which are ON.

Voltage sources 732–737 and signal source 748 are also included in amplifier 700. Persons skilled in the art will appreciate that voltage sources 732–737 may actually be input signals.

Figure 8:
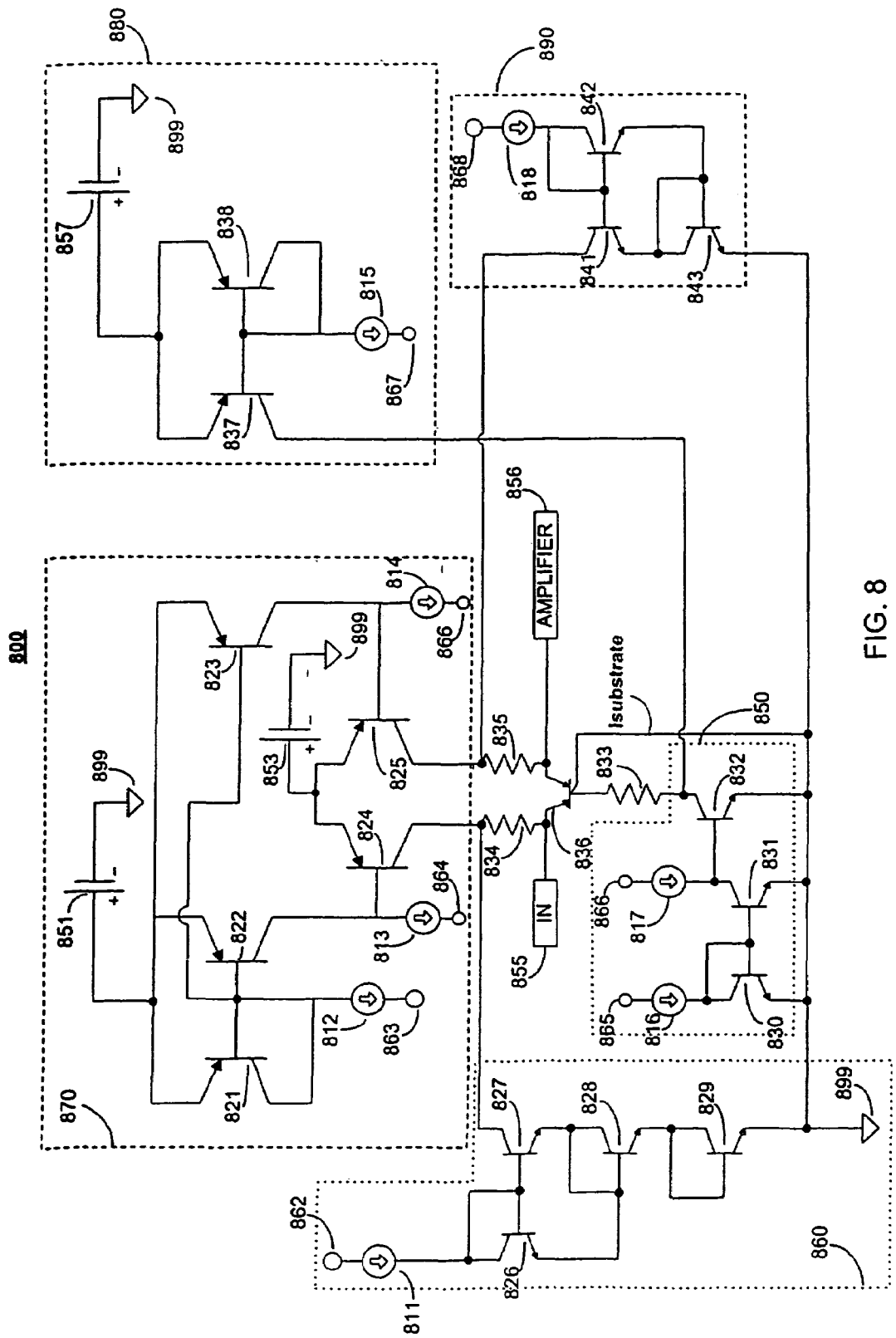
FIG. 8 is a schematic diagram of a switch biasing circuit constructed in accordance with the principles of the present invention.

FIG. 8 shows a switch 836, which may be a bipolar lateral switch (described below), and switch biasing circuitry constructed in accordance with the principles of the present invention for controlling the switching of switch 836. Generally, multiple instances of the biasing circuitry shown in FIG. 8 may be coupled to an amplifier to provide a variable gain operation. More particularly, the biasing circuitry shown in FIG. 8 may be used to bias and control the state of switch 836 with minimal noise contribution.

Figure 9:
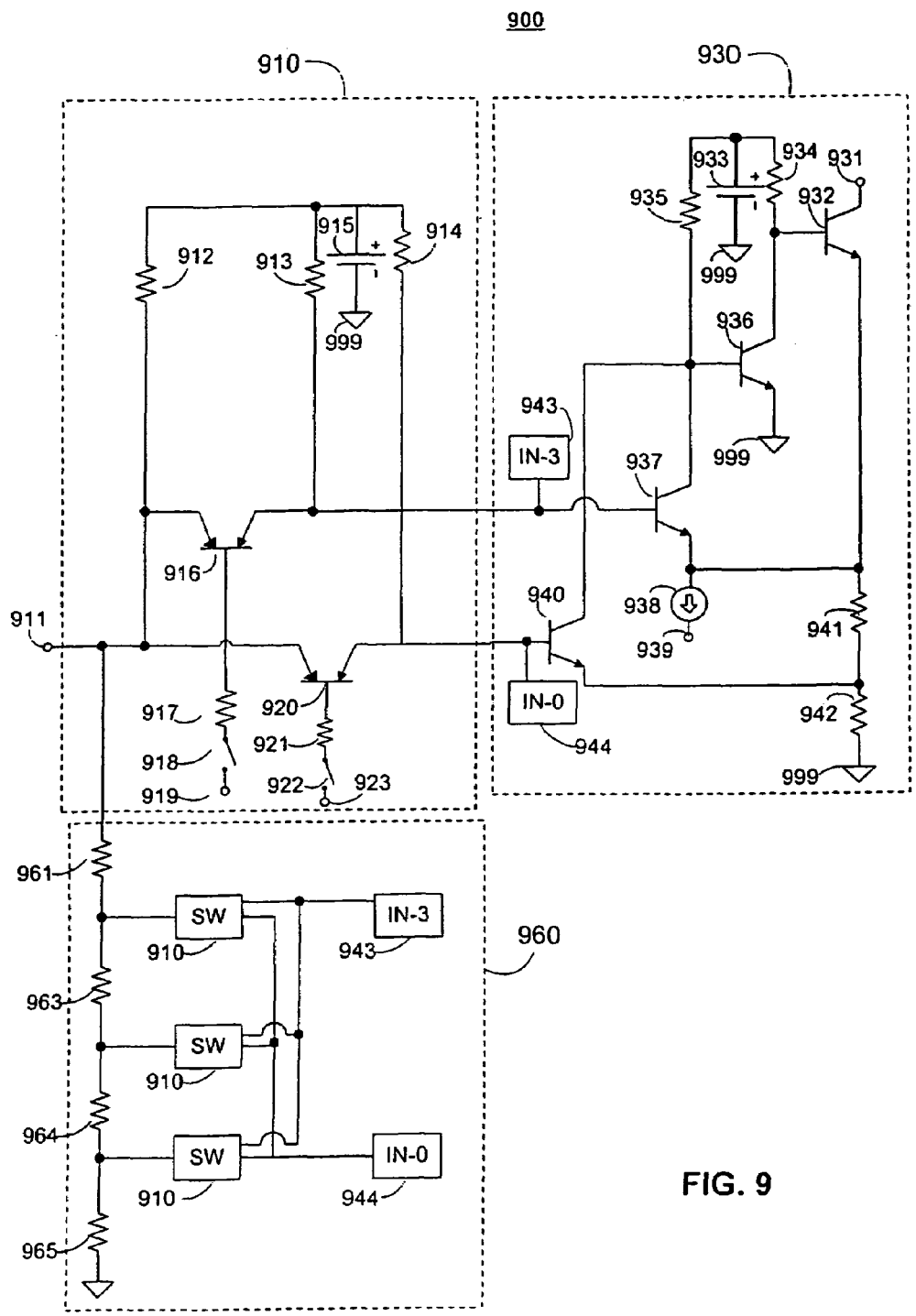
FIG. 9 is a schematic diagram of a variable gain step attenuator constructed in accordance with the principles of the present invention.

Minimal noise contribution with respect to the biasing of switch 836 is important in circuits with a large variable gain switching matrix (e.g., circuit 900 of FIG. 9). For example, a matrix that includes a plurality of circuits 800 may be placed between (or integrated into) an amplifier's input resistive divider (e.g., resistors 961, 963, 964 and 965 of FIG. 9 or resistors 481 and 484 of FIG. 4) and the amplifier's inputs (e.g., input 930 of FIG. 9). In this manner, circuit 800 may be used to control which amplifier input will be active (e.g., forward biased), which amplifier will receive input signals, and the amount of input voltage an amplifier will receive, with the addition selectable resistive taps (e.g., the connections between resistors 961, 963, 964, and 965 of FIG. 9).

Multiple instances of circuit 800 may also be employed to control the DC bias voltage (e.g., voltage sources 731–737 of FIG. 7) being supplied to an amplifier (e.g., amplifier 700) such that one or more input transistor pairs (e.g., transistors 766 and 743 of FIG. 7) may be selected and activated. In selecting an input transistor pair, an associated gain step (e.g., transconductance) is selected for that circuit. Thus, circuit 800 may provide an alternative variable gain functionality employed through the control of an amplifier's DC bias voltage. As stated, circuit 800 is preferably constructed such that minimal noise contribution exists in device circuit 800.

Circuit 800 may be coupled to an amplifier such as amplifier 400 shown in FIG. 4. The interconnection may be configured as follows. The connection between nodes 404 and 405 of FIG. 4 may be removed such that circuit 800 is coupled in series with nodes 404 and 405 of FIG. 4 by coupling input 855 to node 404 and coupling amplifier contact 856 to node 405.

As explained above, the biasing circuit in FIG. 8 is configured to bias bipolar switch device 836. The fabrication of bipolar switch 836 is described below in connection with the descriptions of FIGS. 10, 11A, and 11B. Switch 836, and resistors 833–835, controls if the input signal applied at input 855 is applied at amplifier contact 856. Generally, circuit 850 includes transistor 832 which can couple one terminal of resistor 833 to ground. Circuit 870 includes transistors 824 and 825, which can respectively couple resistors 834 and 835 to voltage supply 853.

Switch 836 is ON when all DC-switch transistors 832, 824, and 825 are ON. Persons skilled in the art will appreciate that resistors 834 and 835 should be dimensioned to minimize the DC offset voltage at input 855 and amplifier contact 856. As a result of switch 836 being ON, contacts 835 and 836 may exhibit near equivalent voltages (e.g., 1.4 volts with a 1 mV difference).

Switch 836 is OFF when all DC-switch transistors 832, 824, and 825 are OFF. The OFF-state bias point of switch 836 is controlled by circuits 880 and 890. Persons skilled in the art will appreciate that transistor 837 becomes saturated and pulls the base terminal of switch 836, via resistor 833, at the highest regulated voltage available at voltage source 857. Transistor 841 will similarly pull contact 856, via resistor 835, to a DC voltage equal to a forward-biased diode (e.g., approximately 0.7 volts) regardless of the DC bias at input 855. Bipolar switch 836 is preferably at 3–5 volts and is effectively isolated from input 855 when the signal at input 855 is over 1 GHz.

Persons skilled in the art will appreciate that when one or more switches 836 are OFF (not shown), the switching matrix is in a shut-down state the DC bias voltage of input 855 can drift to ground or a supply voltage through external coupling leakage. Current source 811 can sustain external capacitor leakage such that DC voltage input 855 will preferably be the voltage across two diodes (e.g., approximately 1.4 volts). As a result, unwanted delays are avoided and fast transition from a shut-down to ON state is insured.

Persons skilled in the art will appreciate that, if desired, circuit 800 or a matrix that includes a plurality of circuits 800 may be utilized to select one of multiple inputs, but apply no signal to an attached amplifier device. Continuing this example, if the amplifier was amplifier 200 of FIG. 2 and circuit 800 did not supply a selected input, then amplifier 200 could still provide bias current to any amplifier which is being driven by amplifier 200 (e.g., amplifier 300 of FIG. 3 which is driven as shown in amplifier 400 of FIG. 4) without having an output current that is associated to a selected input.

One alternative method to bias switch 836 is to employ active current sources instead of resistors 833, 834 and 835. Persons skilled in the art will also appreciate that if circuit 800 was coupled to circuit 400 of FIG. 4, for example, resistors 833, 834 and 835 would, in a preferred embodiment, be sized to resistors 481 and 441 of FIG. 4, respectively. In sizing resistors 833, 834 and 835, circuit 800 bias noise can successfully be incorporated into any circuit without adding additional noise dynamics to that circuit.

Control circuit 850 includes transistor 832, current sources 816 and 817 referenced against contacts 865 and 866, and a current mirror circuit that is made up of transistors 830 and 831. Control circuit 850 controls the state of transistor 832 such that when transistor 832 is OFF, the base terminal of transistor 836 is applied to ground 899. Persons skilled in the art will appreciate that ground 899 may also be a virtual ground (e.g., ground 899 may be a set voltage with minimal voltage swing).

Control circuit 860 includes transistors 826–829, current source 811, and terminal 862. Control circuit 860 preferably controls the voltage across resistor 834. Control circuit 870, in addition to the components listed above, further includes voltage source 851, which as with voltage source 853, is referenced by ground 832. Control circuit 870 also includes transistors 821–823, current sources 812–814, and terminals 863, 864 and 866, and preferably controls the state of switch 836.

Control circuit 880 includes transistors 837 and 836 powered by voltage source 857, which is preferably coupled to ground 899, and current source 815, which is preferably coupled to terminal 867. Control circuit 880 preferably controls, in part, when the base of switch 836 is HIGH. Moreover, control circuit 890 includes transistors 841–843, current source 818, and control terminal 868, and preferably controls the voltage across resistor 835.

FIG. 9 shows a circuit (e.g., an attenuator circuit) that is constructed in accordance with the principles of the present invention. Circuit 900, as shown in FIG. 9, employs multiple instances of circuit 800. In particular, circuit 910 employs two instances of circuit 800 due to the differential operation of circuit 900. In this manner, the controlling of two switches (e.g., the two switches of a differential amplifier) is accomplished. Persons skilled in the art will appreciate that, although circuit 910 does not contain all of the components depicted in circuit 800 of FIG. 8, the invention is not limited in this manner.

Persons skilled in the art will further appreciate that circuit 900 may be incorporated into an amplifier (e.g., amplifier 700 of FIG. 7) to provide low-noise multiple gain operation. In one embodiment, circuit 900 is an attenuator circuit that is connected in series between an input and the non-inverting terminal of an amplifier.

Circuit 900 includes multiple switch circuits 910. Each switch circuit 910 preferably includes two bipolar switches 916 and 920 (e.g., bipolar switch 836 of FIG. 8). Gains are controlled by switching bipolar switches 916 and 920 ON by applying an appropriate voltage at nodes 919 and 923, respectively, and closing switches 918 and 922, respectively. Resistors 917 and 921 are included to regulate the signal applied at the base terminals of switches 918 and 922, respectively. Circuit 900 also includes a voltage source 915 and resistors 912–914.

Switching circuits 910 are preferable connected to gain sources 943 and 940. In particular, bipolar switch 916 is connected to gain source 943 and bipolar switch 920 is connected to gain source 940. In turning one of transistors 916 and 920 ON, the signal at input 911 can be attenuated or amplified, with the resulting signal being imposed on output 931.

Circuit 910 is connected as shown in connection topology 960. Switches 910 are preferable connected to an array of resistors in series (e.g., resistors 961 and 963–965) such that a voltage divide occurs when one ore more bipolar switches of switch 910 is ON. In connection topology 960, a different voltage divide occurs depending on where switch 910 is connected in the array of resistors in series (e.g., resistors 961 and 963–965). For example, when bipolar switches 916 and 820 of switch 910 are ON, the voltage supplied to amplifier 930 will be lower if these switches are coupled between resistors 964 and 965 rather than coupled between resistors 961 and 963.

Amplifier circuitry 930 may also included in circuit 900 and includes transistors 940 and 937 and 937. Also included in amplifier circuitry 930 are resistors 935, 934, 941, 942, current source 938 and voltage source 933. Current source 938 can be controlled at terminal 939. Amplifier circuitry 930 controls and regulates the signal that presented at output node 931 and provides a secondary resistive divide with resistors 941 and 942.

Figure 10:
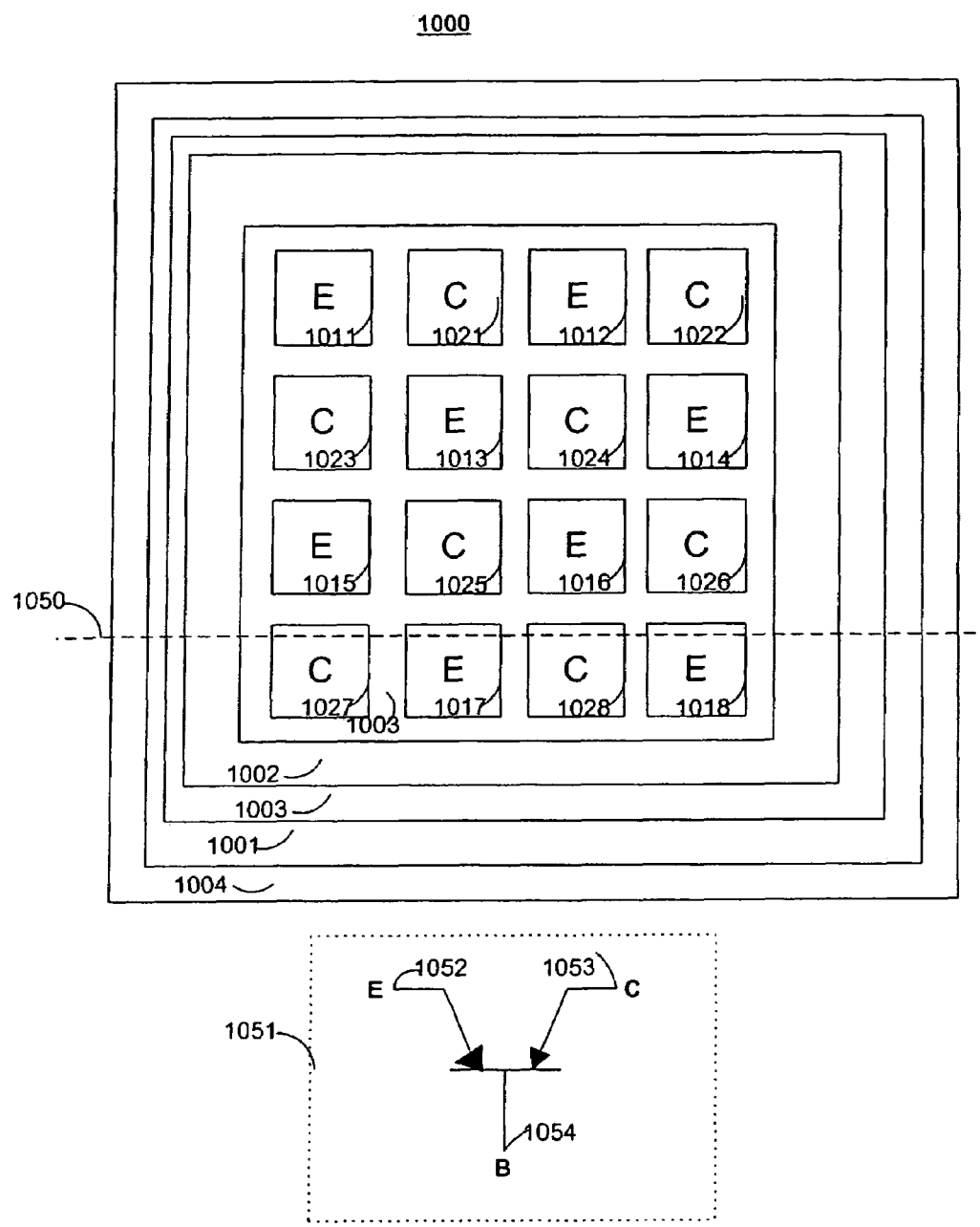
FIG. 10 is a layout topology of an LPNP switch fabricated in accordance with the principles of the present invention.

FIG. 10 illustrates a layout topology for switch 1000 that is fabricated as a high frequency bipolar lateral PNP switch. Switch 1000 may be, for example, bipolar switch 836 of FIG. 8. Switch 1000 is preferably fabricated to operate below 10 MHz, and relies on capacitive coupling to extend operation to frequencies above 10 MHz. Persons skilled in the art will appreciate that switch 1000 can be fabricated as an NPN switch by simply changing the types of the components of switch layout 1000. The electrical symbol for switch 1000 is depicted as symbol 1051. Symbol 1051 includes emitter terminal 1052, collector terminal 1053, and base terminal 1054.

As a PNP switch, switch 1000 includes any number of P+ wells 1011–1018 (e.g., emitter terminal of switch 1000) and P+ wells 1021–1028 (e.g., collector terminal of switch 1000), placed in a common N-type region 1003 (e.g., base terminal of switch 1000). Persons skilled in the art will appreciate that all P+ wells 1011–1018 are coupled together (not show) to form the collector terminal of switch 1000. Similarly, P+ wells 1021–1028 are coupled together (not shown) to form the emitter terminal of switch 1000. Persons skilled in the art will appreciate that a metal or dielectric layer may be used to couple P+ wells 1011–1018 and 1021–1028 together as described above.

Included in N-type region 1003 is P+ moat ring 1002. Persons skilled in the art will also appreciate that N-type region 1003 may be an N-epitaxial region. Surrounding N-type region 1003 (e.g., intrinsic base of switch 1000) is N+ type region 1001. Surrounding N-type region 1003 is a P+ region (e.g., isolation trench).

Persons skilled in the art will appreciate that P+ ring 1002 surrounds the symmetrical layout of the emitter and collector terminals of switch 1000 and is preferably connected to N-type region 1003 (e.g., N-epitaxial tub) to reduce and control the amount of current injected into the substrate of switch 1000 when switch 1000 is in an ON stage. Preferably, control of the current injected into the substrate of switch 100 is independent of the parasitic vertical PNP beta value of switch 1000.

As previously mentioned, P+ wells 1011–1018 and 1021–1028 form the collector and emitter terminals of switch 1000. Persons skilled in the art will appreciate that the designation of P+ wells 1011–1018 as the emitter terminal of switch 1000 is merely for the purpose of illustration. P+ wells 1011–1018 may easily be utilized as the collector terminal of switch 1000 while P+ wells 1021–1028 are utilized as the emitter terminal of switch 1000.

Switch 1000 has both an ON state and an OFF state. Switch 1000 turns ON as a result of current present on an emitter or collector of switch 1000. As a result of switch 1000 being ON, a forward voltage exists between terminals 1011–1018 and terminals 1021–1028 (e.g., a forward voltage exists between terminal 1011 and 1021). An advantage of switch 1000 is that the ON resistance models a single diode, not two separate diodes in a series configuration as is typically modeled by a transistor. The advantage is realized because the transistors of switch 1000 preferably exhibit forward bias at the same voltage level. As a result, the resistance of switch 1000 is a dynamic resistance that may be approximately modeled as a forward diode placed in a series configuration.

As switch 1000 turns ON, a large amount of current goes to P+ region 1003 (e.g., the intrinsic base terminals of the transistors formed by P+ wells 1011–1018 and 1021–1028). Persons skilled in the art will appreciate that because of the configuration of switch 1000, offset is essentially zero. As a result, circuit complexity decreases as switch performance, stability, and reliability increases.

The symmetrical layout of the emitter and collector terminals of switch 1000 also preferably eliminates the switch N-epitaxial tub resistance (e.g., region 1003) in the ON-state of switch 1000 (with respect to the unity gain frequency of a lateral PNP switch) at all frequencies of operation because the signal path is inter P+ wells and no signal goes to a "base terminal" (instead signal preferably goes to the substrate of switch 1000).

Persons skilled in the art will appreciate that switch 1000 may be included as switch 836 of FIG. 8, switch 916 of FIG. 9, or switch 920 of FIG. 9 in accordance with the principles of the present invention. The benefits of doing so may be shown through an example. Suppose that switch 1000 is included in attenuator 800 as switch 836. As a result, switch 1000 would preferably generate an ON-state current and absorb the equivalent resistance in the input-resistor such that the attenuator 800 does not have any noise contribution when attenuator 800 is coupled to a device. Thus, switch 1000 is a substantial improvement over a current source biasing alternative. Another advantage of switch 1000 is realized from the high voltage present in the ON-state of switch 1000, the reverse bias current across the emitter and collector terminals of switch 1000 and N-type region 1003, and diode capacitance that achieves a maximum isolation between the input and output nodes (e.g., PNP emitters and collectors) when switch 1000 is OFF.

Switch 1000 exhibits a lateral PNP effect for input signal frequencies below the lateral unity gain frequency of a PNP transistor. Switch 1000 is configured in a symmetrical collector and emitter layout arrangement (e.g., no voltage offset for equal emitter and collector currents and no voltage offset induced by different temperature gradients), thus lowering the ON-resistance of switch 1000 when compared to a two diode implementation (e.g., an implementation with only two P-wells that are spaced far apart from each other).

Switch 1000, however, preferably fabricates P-wells 1011–1018 and 1021–1028 as close together as possible to create a current multiplication affect. The amplification effect comes from the fact that two P-wells are as close as the process lithography allows (e.g., 0.8–5 microns). The proximity between the P-wells allows a transistor action between the two P-wells. This is not present in discrete diode implementations. In both implementations you need to inject equal currents into the P+ wells.

However, in switch 1000 and for the same bias current, the ON-resistance of switch 1000 is lowered by a considerable factor (e.g., a factor 4 when compared to two-discrete diode implementation). ON-resistance is the dynamic resistance of a diode which is $V_T/I_{BIAS}$ where $I_{BIAS}$ is the bias point and $V_T$ is 26 mV at room temperature. In a two diode implementation you essentially have two resistors in series such that $V_T/I_{BIAS}$ becomes multiplied by 2. Yet, in switch 1000, the ON-resistance is $V_T/[2(I_{BIAS})*2(I_{BIAS})]$. Thus, comparing the ON-resistances as shown above, ON-resistance in switch 1000 is lowered by a factor of 4 when compared to a two diode implementation. This factor is the same no matter how many P+ wells are included in switch 1000. In other words, the total area of P+ wells 1011–1018 and 1021–1028 of switch 1000 is important in determining ON resistance for switch 1000.

Furthermore, the PNP diffusion capacitance of switch 1000 minimizes the resistance between P+ wells 1011–1028 and P+ wells 1021–1028 for signal frequencies above the unity gain frequency of switch 1000. In this manner switch 1000 is included in a circuit as a capacitively coupled high frequency switch.

For signal frequencies above the unity gain frequency of the unity gain frequency of a lateral PNP, no lateral PNP transistor effect exists. As a result, the diffusion capacitance of the diodes represented by P-wells 1011–1018 and 1021–1028 act as a signal pass for the ON state of switch 1000.

Persons skilled in the art will appreciate that although switch 1000 is fabricated on silicon and employs BJT transistors, switch 1000 and any other transistor constructed in accordance with the principles of the present invention may be employed using Metal Oxide Field Effect Transistors (MOSFETs) or other active devices. Additionally, the principles of the present invention could be migrated to off-chip analog devices.

Figure 11A:
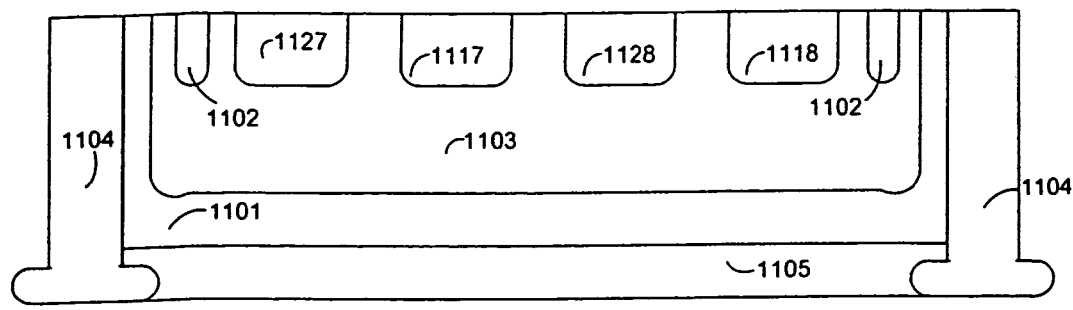
FIG. 11A is a cross-section of the LPNP switch layout topology of FIG. 10 fabricated in accordance with the principles of the present invention.
Figure 11B:
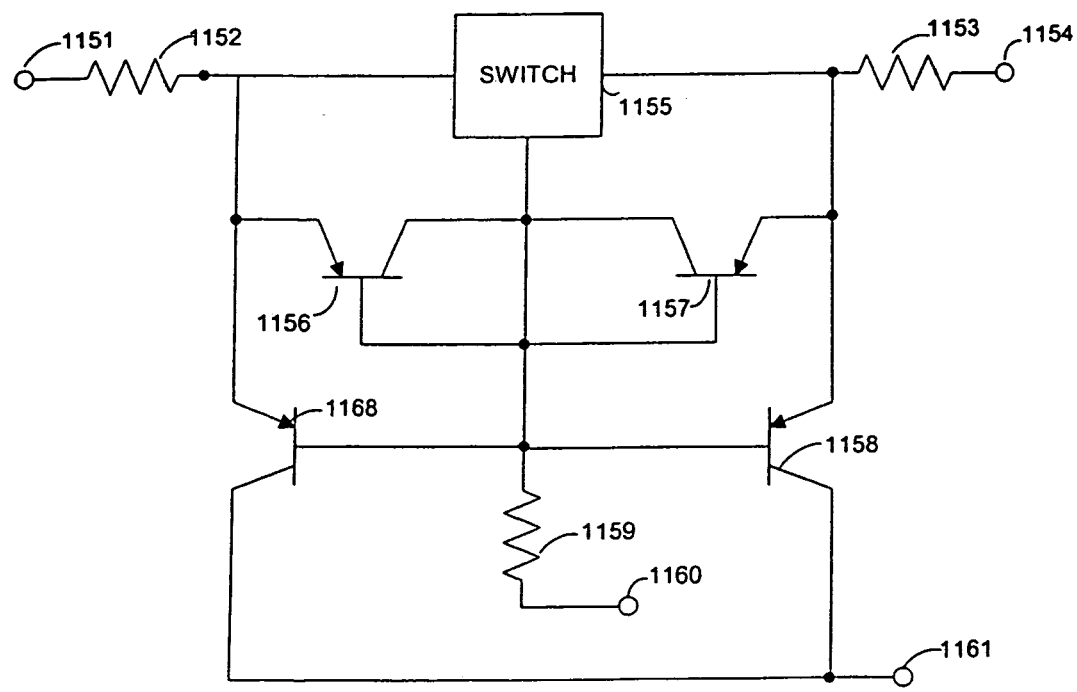
FIG. 11B is a diagram of the LPNP switch of FIG. 10 constructed in accordance with the principles of the present invention.

The composition of the structures introduced in switch 1000 is also illustrated in switch cross-section 1100 of FIG. 11A. FIG. 11A illustrates cross-section 1100 of switch 1000 of FIG. 10 about line 1050 of FIG. 10 wherein the reference numerals 11XX of FIG. 11 denote the same structure as corresponding reference numerals 10XX of FIG. 10. Additionally, the electrical equivalent of switch 1000 of FIG. 10 is depicted in circuit 1150 of FIG. 11B. The following discussion will utilize components from both FIGS. 11A and 11B where reference numerals 1100–1149 refer to FIG. 11A and reference numerals 1150–1199 reference FIG. 11B.

Switch 1155 includes an emitter, collector, and base terminal. The base terminal of switch 1155 is N-epitaxial layer 1103, the common base for all PNP devices. Persons skilled in the art will appreciate that N+ region 1101 may be used as the base terminal of switch 1155 and be coupled with for electrical contacts (e.g., metal or dielectric contacts). The emitter terminal of switch 1155 corresponds to P+ well 1127 and P+ well 1128. Similarly, the collector terminal of switch 1155 corresponds to P-wells 1117 and 1118. Components of circuit 1150 not previously mentioned depict parasitic devices embedded in the cross-section 1100.

For example, resistors 1152 and 1153 show the electrical resistance associated with the contacts to P-wells 1127, 1117, 1128, 1118 and the resistance between P-wells 1127, 1117, 1128, 1118, in N-epitaxial region 1103. Transistors 1156 and 1157 are intended to show the lateral PNP effect between P-wells 1127 and 1118 and P-well ring 1103.

Resistor 1159 depicts the base resistance of N+ type region 1101 and the resistance of N-epitaxial region 1103 to the intersect base between P+ wells 1127, 1117, 1128, 1118. Node 1160 is the vertical surface pickup of layer 1101.

Suppose that switch 1150 is ON (e.g., all P+ wells 1117, 1127, 1128, and 1128 are all forward-biased and applied an equal forward current. This forward bias is implied in the calculation of the ON-resistance of switch 1150 (e.g., switch 1100) at both LOW and HIGH frequencies. At LOW frequencies, the lateral PNP effect occurs. At HIGH frequencies, capacitance diffusion of the PN junctions of the forward-biased P+ wells 1117, 1127, 1128, and 1128 occurs. Current in switch 1000 will flow just below P+ wells 1117, 1127, 1128, and 1128. As a result, there is very little signal current through base resistor 1159 which improves ON-resistance and noise characteristics.

Transistors 1168 and 1158 are vertical substrate PNPs that are also forward biased because the emitter terminals of 1168 and 1158 is the arrangement of P-wells 1117, 1127, 1128, and 1128. Persons skilled in the art will appreciate that the collector current to node 1161 will not be zero, but a quantity depending on the Beta of transistors 1168 and 1158.

Transistors. 1156 and 1157 are included in circuit 1150. The emitter terminals of transistors 1156 and 1157 are the forward-biased P+ well arrangement (e.g., P+ 1127, 1117, 1128, and 118). P+ moat ring 1102 acts as a current mirror with transistors 1168 and 1158 such that the geometric dimensions (e.g., area of the P+ moat ring 1102) will fix current value of substrate 1105 injected in node 1151. Persons skilled in the art will appreciate that the gain of this current mirror is established by area ratios. Furthermore, persons skilled in the art will appreciate that P+ moat ring 1102 is employed to control the quantity of current that flows to the substrate of switch 1100. By changing the doping of ring 1102, the characteristics of current flow to the substrate of layout 1100 will also change.

Persons skilled in the art will appreciate that switch 1000 of FIG. 10 and switch 1100 of FIG. 11 can be constructed to incorporate a variety of transistor configurations. By way of example, switch 1000 can include an extra column of four P+ wells. Doing so would add another transistor to switch 1000 when viewed at cross-section 1050. The modification of the number of wells fabricated in switch 1100 change both performance, stability, and size characteristics.

Portions of an integrated circuit may operate under different temperature conditions. More particularly, circuit components that are placed further from the heat producing components of an integrated circuit (e.g., outputs 1221 and 1222 of circuit 1200) may be influenced by lower temperature gradients than circuit components placed next to heat producing components (e.g., outputs 1221 and 1222 of FIG. 12A).

The performance of transistors in integrated circuits tend to degrade as temperature increases. As shown by example, as temperature increases in a PNP transistor, the charge profile of that transistor's PN junction changes and causes the base emitter voltage to vary slightly. In devices such as amplifiers where performance is attributed to transistor characteristics, amplification can dramatically be affected.

Figure 12A:
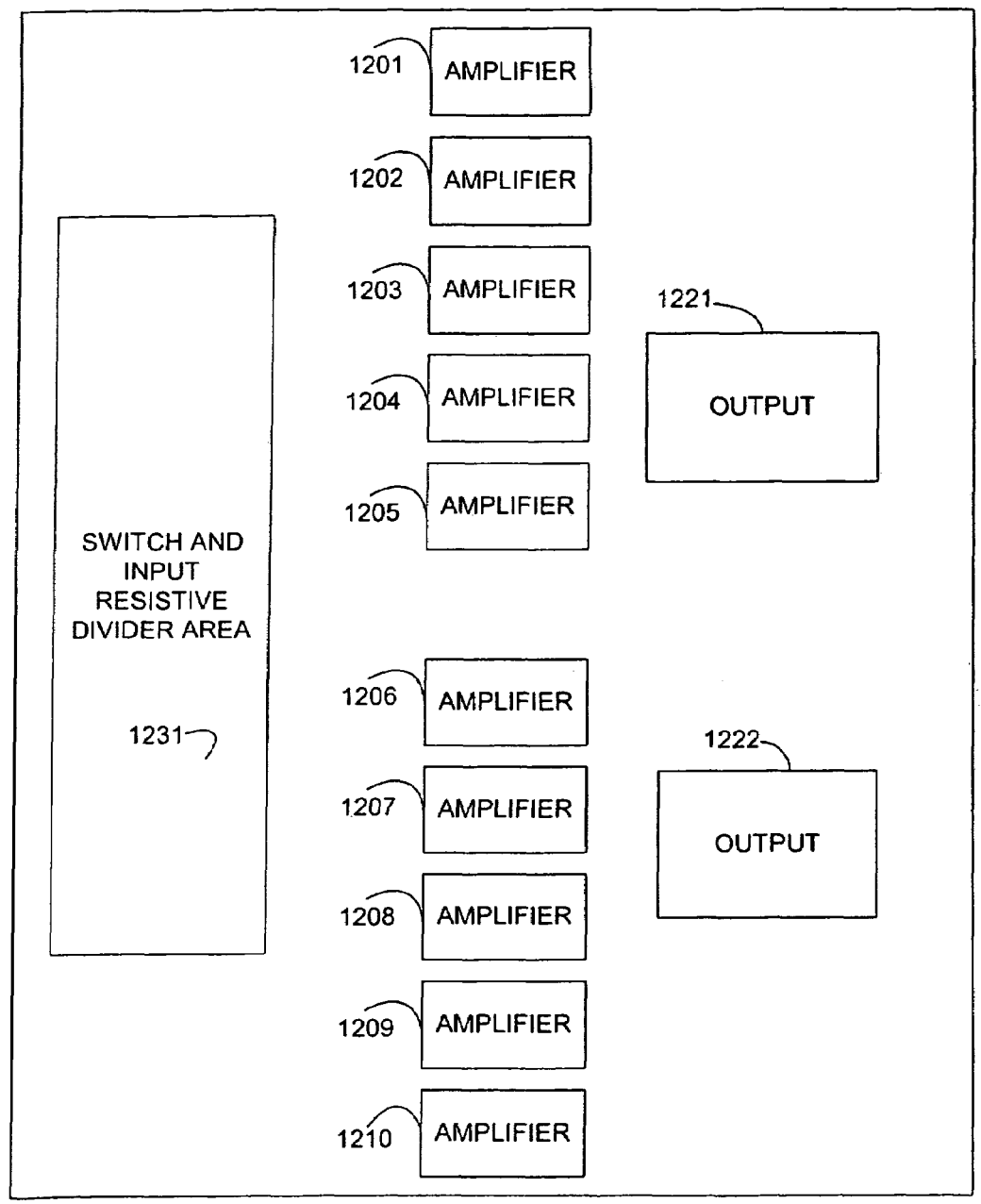
FIG. 12A is a layout topology of an integrated circuit that includes multiple amplifiers fabricated in accordance with the principles of the present invention.

FIG. 12A illustrates integrated circuit 1200 that is fabricated to include amplifiers 1201–1210. Amplifiers 1201–1210 may be, for example, amplifier 400 of FIG. 4. Amplifiers 1201–1210 are placed on circuit 1200 and, depending on an amplifier's location, operate under different temperature gradients at different instances of time. As mentioned, temperature on a chip may change for various reasons. For example, output nodes 1221 and 1221 may be included on circuit 1200 and may be constantly changing values. When output nodes 1221 and 1222 exhibit HIGH voltages, the temperature of circuit 1200 rises at the location of nodes 1221 and 1222 as well as other locations on circuit 1200. Without temperature compensation, amplifiers 1201–1210 will operate differently (e.g., not share the same performance characteristics).

Amplifiers 1201–1210, however, preferably have the same performance characteristics. This is because amplifiers 1201–1210 are individually configured to negate undesired influences of operating under a specific temperature by including in each amplifier 1201–1210 bias current circuitry that always produces a constant current bias independent of the temperature the circuitry is influenced by. Circuit 1231 may be included on chip 1200 and includes a variable gain switch matrix and the input resistive divider, an example of which may be found in circuit 900 of FIG. 9.

Persons skilled in the art will appreciate that amplifiers 1201–1210 may be a single stage amplifier. If an amplifier has multiple large amplification levels or stages, these portions may be biased separately in accordance with the principles of the present invention such that temperature does not introduce distortion into the amplifier as a whole.

Figure 12B:
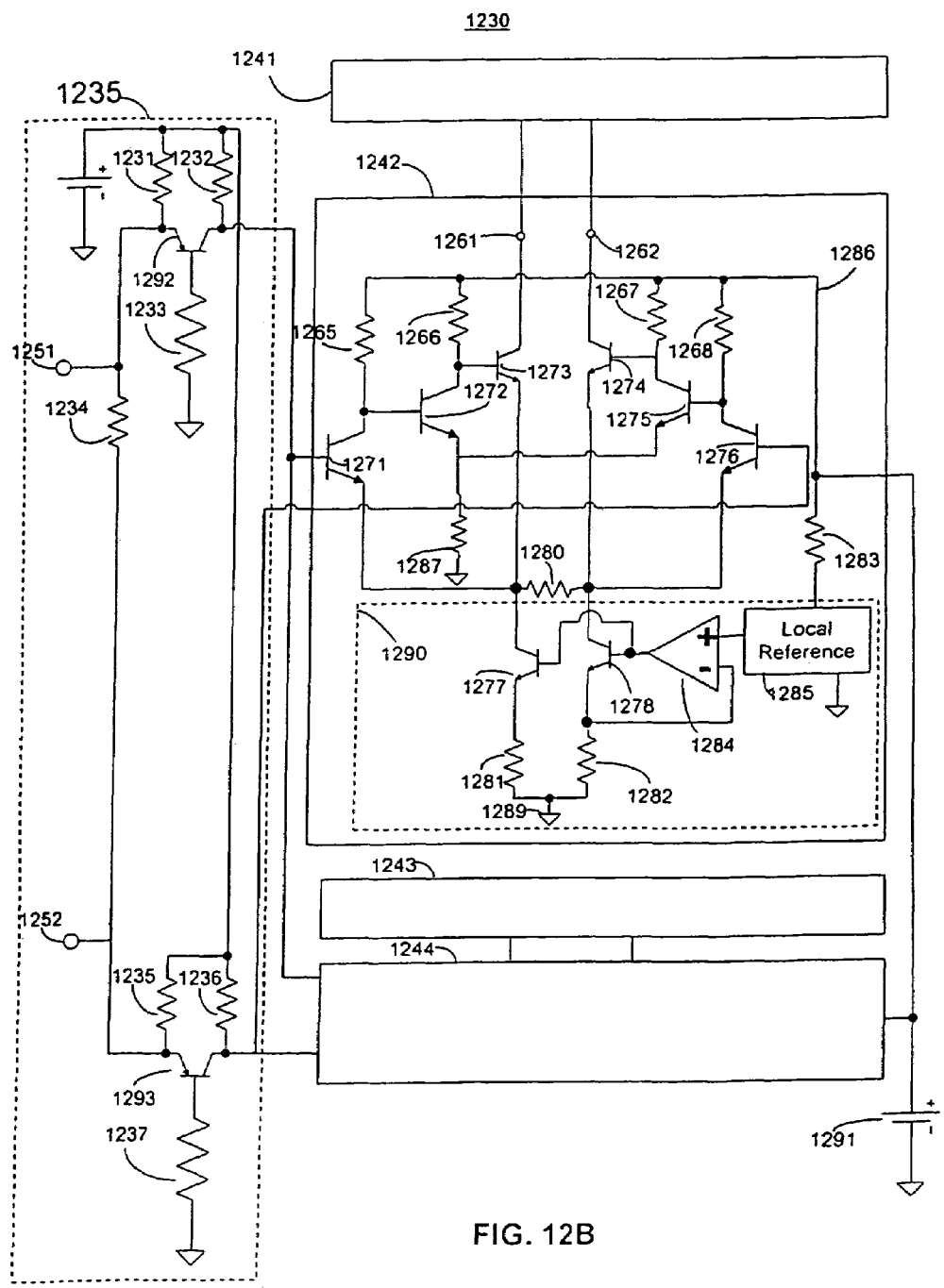
FIG. 12B is a circuit schematic of an amplifier with temperature insensitive biasing constructed in accordance with the principles of the present invention.

FIG. 12B depicts chip circuitry 1250 that includes switching circuitry 1235, differential transconductance enhancing amplifiers 1244 and 1242, differential cascode amplifiers 1241 and 142, and tail current circuitry 1291. Tail current circuitry 1291 is included in amplifier 1242 to maintain the amount bias current to amplifiers 1242 and 1241 regardless of temperature.

Persons skilled in the art will appreciate that a circuit similar to current circuitry 1291 may be included in amplifier 1244 to maintain the amount of bias current to amplifiers 1244 and 1243 regardless of temperature. In doing so, amplifiers 1244 and 1243 may exhibit the same performance characteristics as amplifiers 1242 and 1241, respectively, regardless of any temperature differences between amplifiers 1244 and 1242.

The one-stage amplifier included in circuit 1250 that is represented by amplifiers 1242 and 1241 by be similar to, for example, to amplifier 500 of FIG. 5. The one-stage amplifier included in circuit 1250 that is represented by amplifier 1242 and 1241 may also be similar to, for example, amplifier 500 of FIG. 5. In this manner, amplifier stages 1242 and 1244 may be similar to, for example, a composite transistor amplifier such as amplifier 200 of FIG. 2. Thus, amplifier stages 1241 and 1243 may be similar to, for example, virtual ground cascode amplifier 300 of FIG. 3. Thus, persons skilled in the art will appreciate that amplifier 1243 may be removed from circuit 1250 and amplifier 1244 may be coupled to the secondary input of amplifier 1241 (as shown in FIG. 1300 and included in the description of FIG. 5).

Voltage source 1291 is preferably chosen to set the operating points of amplifier stage 1492. For example, voltage source 1291 is utilized by tail current circuitry 1290. Tail current circuitry 1290 includes transistors 1277 and 1278, resistors 1281 and 1282, local reference 1285, and operational amplifier 1284. Local reference 1285 utilizes the voltage supplied by voltage source 1291 and regulated by resistor 1283 to set the amount of current that passes through transistors 1277 and 1278. Tail current circuitry 1290 may, for example, exhibit a high output impedance for a voltage change in the collector terminals of transistors 1277 and 1278. Voltage source 1291 also affects the operating points of transistors 1271, 1272, 1275, and 1276 via resistors 1265, 1266, 1267 and 1268.

The principles of the temperature compensation realized by biasing circuit 1290 occurs as follows. Suppose, the temperature surrounding amplifier stage 1242 is 4 degrees Celsius higher than the temperature induced upon amplifier stage 1244. If the temperature coefficient of the forward biased diode in transistor 1292 is −2 mV/° Celsius than the voltage drop across transistor 1292 will differ from the voltage drop across transistor 1293 by approximately 8 mV. Thus, the common input nodes between transistors 1271 and 1276 may differ by at least 8 mV. Persons skilled in the art will appreciate that other transistors circuitry 1230 may exhibit similar heat-dependent functionality. Continuing the above example, the 8 mV voltage change will be seen, in part, as the collector terminal voltage change of transistors 1277 and 1288. Tail current circuitry 1290, however, can support this voltage change without any significant change in the bias currents to transistors 1273 and 1274. Thus, tail current circuitry 1290 negates the affects of any temperature differentials imposed on amplifier stage 1242.

Figure 13:
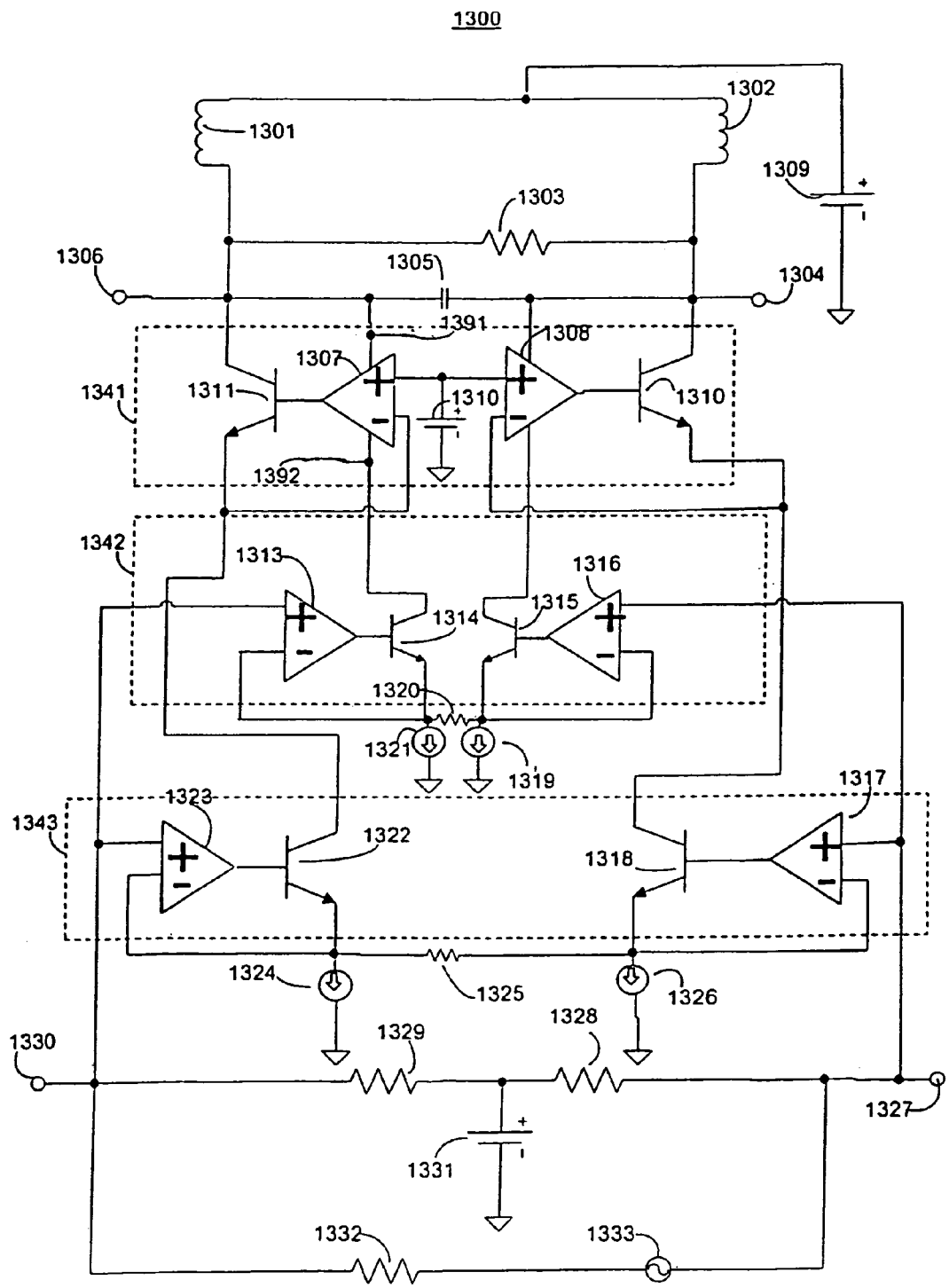
FIG. 13 is a circuit schematic of an amplifier with three differential enhanced composite transistors constructed in accordance with the principles of the present invention.

FIG. 13 depicts amplifier 1300 that employs a dual path amplifier and includes cascode enhanced devices constructed in a differential configuration (e.g., amplifier 1341), each of which are similar to, for example, amplifier 300 of FIG. 3. Amplifier 1341 is fed input signals by two transconductance enhancing devices constructed in a differential configuration (e.g., amplifiers 1342 and 1243), each of which are similar to, for example, amplifier 200 of FIG. 2. Transconductance enhancing amplifier 1342 includes transistors 1314 and 1315 and enhancing components 1313 and 1316.

Generally, amplifier 1342 provides the secondary current input to amplifier 1341 (the interconnection of amplifiers 1342 and 1342 is discussed with the discussion of amplifier 500 of FIG. 5). Persons skilled in the art will appreciate that components 1307 are the performance enhancing components for transistor 1311 (e.g., transistors 311, 312, and 314 of FIG. 3, where node 1391 is the collector terminal of transistor 314 of FIG. 3 and node 1392 is the emitter terminal of transistor 314 of FIG. 3). Similarly, components 1308 are the performance enhancing components for transistor 1310.

Amplifier 1343 provides the main current input to amplifier 1341. Amplifier 1341 receives current input from amplifiers 1342 and 1343 and outputs this same current onto external load 1303 and 1305 to create and output voltage across contacts 1306 and 1304.

Persons skilled in the art will appreciate that any current or voltage source in accordance with the principles of the present invention may be internal to a circuit or external to that circuit. In this manner, specific components may be located external to a circuit. For example, inductor chokes 1301 and 1303 may be internal to an integrated circuit (e.g., located on the chip) to supply the DC bias current from an external source (e.g., voltage source 1309). Additionally, components in accordance with the principles of the present invention may be replaced by different components so long as the principle of that component is still embodied. For example, resistor 1332 and signal source 1333 model the same principles as a voltage input source and, thus, may be included as a voltage input source.

From input nodes 1330 and 1327, input resistors 1329 and 1328 may be coupled to an attenuator resistor ladder similar to, for example, portions of circuit 900 of FIG. 9. Source 1351 is preferably an internal regulated voltage supply.

Persons skilled in the art will appreciate that amplifier 1300 is preferably a single stage amplifier because bias tail current sources 1324 and 1326 and 1321 and 1319 are used to bias multiple amplification stages (e.g., tail current source 1321 biases amplifier 1342 and 1341) while the virtual grounds present in amplifier 1341 (Not shown but described in connection with amplifier 300) bias amplifiers 1342 and 1343. As a result, considerable dissipated power savings occurs.

Persons skilled in the art will appreciate the amplifiers of amplifier 1300 may be biased independently. On example of a situation where independent biasing would be beneficial is if the amplifiers of 1300 are large such that there is a large temperature differential between them. In such instances, the amplifiers may preferably be biased by a temperature insensitive biasing circuit such as circuit 1290 of FIG. 12. Either way, tail current sources 1321, 1319, 1324, and 1396 may be similar to temperature insensitive biasing circuit such as circuit 1290 of FIG. 12.

Because of the high performance of amplifiers 1341, 1342, and 1343 a very large power gain (e.g., 32 dBpower gain) may be realized by amplifier 1300. A HIGH input differential impedance exists in amplifier 1343 that is much higher (e.g., 4 kilo-ohms) than the value of resistors 1329 (e.g., 50 ohm) and 1328 (e.g., 50 ohm). However, the input differential impedance of amplifier 1300 is typically approximately the same as resistors 1329 and 1328 when in a series configuration (e.g., approximately 100 ohms). Persons skilled in the art will appreciate that resistors 1328 and 1329 may be removed or enlarged to increase and manipulate the power gain of amplifier 1300.

Due to the high output impedance of amplifier 1341, the output current will be impressed upon output load 1303 (e.g., 200 ohms). Most of the power created by amplifier 1341 will be realized at output nodes 1306 and 1304 due to the HIGH output impedance (e.g., approximately 4 kilo-ohms). Persons skilled in the art will appreciate that resistor 1303 may be used to model the resistance of a load coupled between outputs 1306 and 1304 while capacitor 1305 may be used to model the capacitance of a load coupled between outputs 1306 and 1304.

Reverse isolation of amplifier 1300 is HIGH because of the virtual ground input feature of amplifier 1341 and the intrinsic high isolation of amplifiers 1342 and 1343 such that the output signal does not leak at input nodes 1327. Persons skilled in the art will appreciate that the shut down the signal pass in amplifier 1342 may be shut down by turning OFF the lateral PNP switch at its input (not shown). As a result, the output current of amplifier 1300 will be lower than if amplifier 1342 is ON. Thus, amplifier 300 has a variable gain method. Persons skilled in the art will appreciate that other variable gain methods are present for amplifier 1300. For example, resistors 1329 and 1328 may be variable resistors.

For the best linearity performance of amplifier 1300, the ratio of primary v. secondary current input signals levels should be adjusted such that the non-linearity created in amplifier 1341 will have such a phase and amplitude that when summed at output nodes 1306 and 1304 these will cancel.

As previously discussed, persons skilled in the art will appreciate that amplifier stages 1244 and 1242 of FIG. 12 can be coupled to stage 1241 of FIG. 12 and form an amplifier similar to amplifier 1300. In such an embodiment, stage 1243 would preferably be removed. As a result of the temperature compensation circuitry included in circuit 1200, both stages 1241 and 1244 will operate preferably with the same characteristics, regardless of the temperatures gradients affecting stages 1241 and 1244.

The usage of multiple amplifier stages preferably creates an output voltage swing at contacts 1306 and 1304 that is approximately the same as a single transistor implementation. For example, the single ended minimum voltage at output contact 1306 can be as low as $V_{CE311}+V_{CE1322}+V_{CE1324}$ (e.g., approximately 1.5 volts with respect to ground).

Transistors 1311, 1322, and, a transistor in current source 1290 (Not Shown, but present if current source 1324 is includes as, for example, circuit 1290 of FIG. 12) are preferably stacked in a series configuration. Each of these transistors is biased at very low $V_{CE}$ (e.g., 0.5 volts). As a result, the bias current in these transistors are reused and allow a maximum possible voltage swing at output node 1306.

The maximum output voltage at output 1306 is preferably limited by collector-base breakdown of transistor 1311. As shown by example, if the collector-base breakdown of transistor 1311 occurs at 8 volts, and an internal bias source 1312 of 2 volts is applied, a 10 volt maximum output swing with respect to ground would. The midpoint will be the optimum point of external bias source 1305 which may be, for example, approximately 5 volts.

Persons skilled in the art will appreciate that because power is voltage multiplied by current, realizing a large output current swing is advantageous. Peak current can be as high as the tail value of current source 1324. As a result, output current can be as high as the tail value of current source 1324 (e.g., there is a true "plus A" operation until the tripping of current source 1324). A "plus A" operation occurs when all transistors of amplifier 1300 are in an active mode (e.g., the collector current of all transistors of amplifier 1300 are >0).

Persons skilled in the art will appreciate that the frequency response of transconductance enhancing stages 1342 and 1343 can be adjusted with the frequency response of cascode amplifier stage 1341, taking into account on chip parasitics, such that the frequency response of amplifier 1300 is optimized. As a result amplifier 1300 can operate, for example, as a high performance intermediate frequency (IF) amplifier and is not limited to low frequency (e.g., baseband) amplifier designs.

As shown above, amplifier 1300 operates with the lowest complexity local feedback to provide the highest unity gain for an enhanced amplification device. More particularly, the unity gain frequency of amplifier 1300 may be, for example, 5–10% of the unity gain frequency of an NPN transistor fabricated in accordance with the principles of the present invention.

The above described embodiments of the present invention are presented for purposes of illustration and not of limitation, and the present invention is limited only by the claims which follow.

What is claimed is:

1. A grounded input active cascode amplifier with increased gain that provides an output current to a load, said amplifier comprising:
   a first transistor, wherein the base terminal of said first transistor is coupled to a first supply voltage and the collector terminal of said first transistor is biased with a first current source;
   a second transistor, wherein the base terminal of said second transistor is coupled to the collector terminal of said first transistor, the emitter terminal of said second transistor is coupled to an error control input, and the collector terminal of said second transistor is biased with a second current source;
   a third transistor, wherein the base terminal of said third transistor is coupled to a second supply voltage and the emitter terminal of said third transistor is coupled to the emitter terminal of said second transistor; and
   a fourth transistor, wherein the base terminal of said fourth transistor is coupled to said collector terminal of said second transistor, the collector terminal of said fourth transistor is coupled to the collector terminal of said third transistor, the emitter terminal of said fourth transistor is coupled to the emitter terminal of said first transistor, said emitter terminal of said fourth transistor that receives an input signal to be amplified, and said output current being derivable from the collector terminal of said fourth transistor; and
   a feed forward circuit that is coupled between the base terminal of said second transistor and the emitter terminal of said first transistor.

2. The amplifier of claim 1 wherein said feed forward circuit comprises a capacitor and a resistor, said capacitor is coupled between said resistor and the emitter terminal of said first transistor, and said resistor is coupled between the base terminal of said second transistor and said capacitor.

3. The amplifier of claim 1 further comprising a bandwidth limiting circuit is coupled between said collector terminal of said second transistor and ground, wherein said bandwidth limiting comprises a resistor and a capacitor, said capacitor is coupled between ground and said resistor, and said resistor is coupled between said capacitor and the collector terminal of said second transistor.

4. The amplifier of claim 1 further comprising a gain enhancing transistor, wherein the base of the gain enhancing transistor is coupled to the base of said fourth transistor, the collector of said gain enhancing transistor is coupled to the collector of said fourth transistor, the emitter of said gain enhancing transistor is coupled to ground.

5. The amplifier of claim 1 wherein the emitter terminal of said first transistor and the emitter terminal of said fourth transistor is a virtual ground.

6. A grounded input active cascode amplifier with increased gain that provides an output current to a load, said amplifier comprising:
   a first transistor, wherein the base terminal of said first transistor is coupled to a first supply voltage and the collector terminal of said first transistor is biased with a first current source;
   a second transistor, wherein the base terminal of said second transistor is coupled to the collector terminal of said first transistor, the emitter terminal of said second transistor is coupled to an error control input, and the collector terminal of said second transistor is biased with a second current source;
   a third transistor, wherein the base terminal of said third transistor is coupled to a second supply voltage and the emitter terminal of said third transistor is coupled to the emitter terminal of said second transistor; and
   a fourth transistor, wherein the base terminal of said fourth transistor is coupled to said collector terminal of said second transistor, the collector terminal of said fourth transistor is coupled to the collector terminal of said third transistor, the emitter terminal of said fourth transistor is coupled to the emitter terminal of said first transistor, said emitter terminal of said fourth transistor that receives an input signal to be amplified, and said output current being derivable from the collector terminal of said fourth transistor; and
   a bandwidth limiting circuit that is coupled between said collector terminal of said second transistor and ground.

7. The amplifier of claim 6 wherein said bandwidth limiting comprises a resistor and a capacitor, said capacitor is coupled between ground and said resistor, and said resistor is coupled between said capacitor and the collector terminal of said second transistor.

8. The amplifier of claim 6 further comprising a gain enhancing transistor, wherein the base of the gain enhancing transistor is coupled to the base of said fourth transistor, the collector of said gain enhancing transistor is coupled to the collector of said fourth transistor, the emitter of said gain enhancing transistor is coupled to ground.

9. The amplifier of claim 6 wherein the emitter terminal of said first transistor and the emitter terminal of said fourth transistor is a virtual ground.

10. A grounded input active cascade amplifier with increased gain that provides an output current to a load, said amplifier comprising:
    a first transistor, wherein the base terminal of said first transistor is coupled to a first supply voltage and the collector terminal of said first transistor is biased with a first current source;
    a second transistor, wherein the base terminal of said second transistor is coupled to the collector terminal of said first transistor, the emitter terminal of said second transistor is coupled to an error control input;

a third transistor, wherein the emitter terminal of said third transistor is coupled to the emitter terminal of said second transistor; and a fourth transistor, wherein the base terminal of said fourth transistor is coupled to said collector terminal of said second transistor, the collector terminal of said fourth transistor is coupled to the collector terminal of said third transistor, the emitter terminal of said fourth transistor is coupled to the emitter terminal of said first transistor, said emitter terminal of said fourth transistor that receives an input signal to be amplified, and said output current being derivable from the collector terminal of said fourth transistor; and a feed forward circuit that is coupled between the base terminal of said second transistor and the emitter terminal of said first transistor.

11. The amplifier of claim 10 wherein said feed forward circuit comprises a capacitor and a resistor, said capacitor is coupled between said resistor and the emitter terminal of said first transistor, and said resistor is coupled between the base terminal of said second transistor and said capacitor.

12. The amplifier of claim 10 further comprising a bandwidth limiting circuit is coupled between said collector terminal of said second transistor and ground, wherein said bandwidth limiting comprises a resistor and a capacitor, said capacitor is coupled between ground and said resistor, and said resistor is coupled between said capacitor and the collector terminal of said second transistor.

13. The amplifier of claim 10 further comprising a gain enhancing transistor, wherein the base of the gain enhancing transistor is coupled to the base of said fourth transistor, the collector of said gain enhancing transistor is coupled to the collector of said fourth transistor, the emitter of said gain enhancing transistor is coupled to ground.

14. The amplifier of claim 10 wherein the emitter terminal of said first transistor and the emitter terminal of said fourth transistor is a virtual ground.

15. A grounded input active cascode amplifier with increased gain that provides an output current to a load, said amplifier comprising:

a first transistor, wherein the base terminal of said first transistor is coupled to a first supply voltage and the collector terminal of said first transistor is biased with a first current source;

a second transistor, wherein the base terminal of said second transistor is coupled to the collector terminal of said first transistor, and the emitter terminal of said second transistor is coupled to an error control input;

a third transistor, wherein the emitter terminal of said third transistor is coupled to the emitter terminal of said second transistor; and a fourth transistor, wherein the base terminal of said fourth transistor is coupled to said collector terminal of said second transistor, the collector terminal of said fourth transistor is coupled to the collector terminal of said third transistor, the emitter terminal of said fourth transistor is coupled to the emitter terminal of said first transistor, said emitter terminal of said fourth transistor that receives an input signal to be amplified, and said output current being derivable from the collector terminal of said fourth transistor; and a bandwidth limiting circuit that is coupled between said collector terminal of said second transistor and ground.

16. The amplifier of claim 15 wherein said bandwidth limiting comprises a resistor and a capacitor, said capacitor is coupled between ground and said resistor, and said resistor is coupled between said capacitor and the collector terminal of said second transistor.

17. The amplifier of claim 15 further comprising a gain enhancing transistor, wherein the base of the gain enhancing transistor is coupled to the base of said fourth transistor, the collector of said gain enhancing transistor is coupled to the collector of said fourth transistor, the emitter of said gain enhancing transistor is coupled to ground.

18. The amplifier of claim 15 wherein the emitter terminal of said first transistor and the emitter terminal of said fourth transistor is a virtual ground.

* * * * *